(12) United States Patent
Kim et al.

(10) Patent No.: US 10,164,030 B2
(45) Date of Patent: Dec. 25, 2018

(54) SEMICONDUCTOR DEVICE AND METHOD OF FABRICATING THE SAME

(71) Applicant: Samsung Electronics Co., Ltd., Suwon-si (KR)

(72) Inventors: Jin-bum Kim, Seoul (KR); Chul-sung Kim, Seongnam-si (KR); Deok-han Bae, Anyang-si (KR); Bon-young Koo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/604,687

(22) Filed: May 25, 2017

(65) Prior Publication Data

US 2017/0271462 A1    Sep. 21, 2017

Related U.S. Application Data

(63) Continuation of application No. 14/861,794, filed on Sep. 22, 2015, now Pat. No. 9,679,977.

(30) Foreign Application Priority Data

Sep. 23, 2014   (KR) .................. 10-2014-0127189

(51) Int. Cl.
*H01L 29/41* (2006.01)
*H01L 21/82* (2006.01)
(Continued)

(52) U.S. Cl.
CPC ............. *H01L 29/41783* (2013.01); *H01L 21/823821* (2013.01); *H01L 21/823871* (2013.01);
(Continued)

(58) Field of Classification Search
CPC ................................. H01L 29/41783
(Continued)

(56) References Cited

U.S. PATENT DOCUMENTS

| 6,724,008 B2 | 4/2004 | Fitzgerald |
| 6,724,019 B2 | 4/2004 | Oda et al. |

(Continued)

FOREIGN PATENT DOCUMENTS

| JP | 2009-043938 A | 2/2009 |
| KR | 10-2005-0065109 A | 6/2005 |

(Continued)

*Primary Examiner* — Moazzam Hossain
*Assistant Examiner* — Omar Mojaddedi
(74) *Attorney, Agent, or Firm* — Muir Patent Law, PLLC

(57) ABSTRACT

A semiconductor device may include a substrate including an NMOS region and a PMOS region, and having a protrusion pattern; first and second gate structures respectively formed on the NMOS region and the PMOS region of the substrate, crossing the protrusion pattern, and extending along a first direction that is parallel to an upper surface of the substrate; first and second source/drain regions formed on both sides of the first and second gate structures; and first and second contact plugs respectively formed on the first and second source/drain regions, wherein the first contact plug and the second contact plug are asymmetric. Methods of manufacturing are also provided.

13 Claims, 34 Drawing Sheets

(51) Int. Cl.
   *H01L 27/092*  (2006.01)
   *H01L 29/66*   (2006.01)
   *H01L 29/417*  (2006.01)
   *H01L 29/78*   (2006.01)
   *H01L 29/165*  (2006.01)
   *H01L 21/8238* (2006.01)

(52) U.S. Cl.
   CPC .... *H01L 27/0924* (2013.01); *H01L 29/66545* (2013.01); *H01L 29/785* (2013.01); *H01L 29/7848* (2013.01); *H01L 21/823814* (2013.01); *H01L 29/165* (2013.01)

(58) Field of Classification Search
   USPC ........................................................ 257/369
   See application file for complete search history.

(56) References Cited

U.S. PATENT DOCUMENTS

| | | | |
|---|---|---|---|
| 7,368,357 B2 | 5/2008 | Lee | |
| 7,425,500 B2 | 9/2008 | Metz et al. | |
| 7,439,142 B2 | 10/2008 | Samoilov et al. | |
| 7,554,165 B2 | 6/2009 | Hokazono | |
| 7,612,414 B2 | 11/2009 | Chen et al. | |
| 7,692,254 B2 | 4/2010 | Anderson et al. | |
| 7,723,192 B2 | 5/2010 | Carter et al. | |
| 7,750,338 B2 | 7/2010 | Wang | |
| 7,759,199 B2 | 7/2010 | Thomas et al. | |
| 7,864,592 B2 | 1/2011 | Murthy et al. | |
| 7,884,353 B2 | 2/2011 | Currie et al. | |
| 7,898,041 B2 | 3/2011 | Radosavljevic et al. | |
| 7,910,994 B2 | 3/2011 | Yu et al. | |
| 7,915,693 B2 | 3/2011 | Okano | |
| 7,989,901 B2 | 8/2011 | Lin et al. | |
| 8,043,920 B2 | 10/2011 | Chan et al. | |
| 8,116,121 B2 | 2/2012 | Kawasaki | |
| 8,168,501 B2 | 5/2012 | Yu et al. | |
| 8,211,761 B2 | 7/2012 | Tan et al. | |
| 8,232,191 B2 | 7/2012 | Fukuda et al. | |
| 8,263,451 B2 | 9/2012 | Su et al. | |
| 8,367,528 B2 | 2/2013 | Bauer et al. | |
| 8,450,165 B2 | 5/2013 | Bohr | |
| 8,460,990 B2 | 6/2013 | Kim et al. | |
| 8,623,728 B2 | 1/2014 | Chang et al. | |
| 8,633,516 B1 | 1/2014 | Wu et al. | |
| 8,642,434 B2 | 2/2014 | Liu et al. | |
| 8,703,556 B2 | 4/2014 | Kelly et al. | |
| 8,759,184 B2 | 6/2014 | Ho et al. | |
| 8,796,093 B1 | 8/2014 | Cheng et al. | |
| 9,142,642 B2 | 9/2015 | Chen et al. | |
| 9,318,578 B2 | 4/2016 | Basker et al. | |
| 2006/0216880 A1 | 9/2006 | Suto | |
| 2006/0289940 A1 | 12/2006 | Hyun et al. | |
| 2007/0148837 A1 | 6/2007 | Shah et al. | |
| 2008/0111197 A1 | 5/2008 | Mikasa | |
| 2008/0185612 A1 | 8/2008 | Fukuda et al. | |
| 2008/0237737 A1* | 10/2008 | Chen ................... H01L 21/3185 257/382 |
| 2009/0152590 A1 | 6/2009 | Adam et al. | |
| 2009/0246921 A1 | 10/2009 | Cheng et al. | |
| 2011/0073952 A1 | 3/2011 | Kwok et al. | |
| 2011/0079855 A1 | 4/2011 | Chan et al. | |
| 2011/0298058 A1 | 12/2011 | Kawasaki et al. | |
| 2012/0001228 A1 | 1/2012 | Chong et al. | |
| 2012/0091533 A1 | 4/2012 | Kim et al. | |
| 2012/0100686 A1 | 4/2012 | Lu et al. | |
| 2012/0153387 A1 | 6/2012 | Murthy et al. | |
| 2012/0171864 A1 | 7/2012 | Akiyama et al. | |
| 2012/0241765 A1 | 9/2012 | Cheng et al. | |
| 2013/0049126 A1* | 2/2013 | Flachowsky .... H01L 21/823807 257/369 |
| 2013/0069172 A1 | 3/2013 | Liao et al. | |
| 2013/0207166 A1 | 8/2013 | Chen et al. | |
| 2013/0228862 A1 | 9/2013 | Lee et al. | |
| 2013/0248948 A1 | 9/2013 | Ma et al. | |
| 2014/0001520 A1 | 1/2014 | Glass et al. | |
| 2014/0065782 A1* | 3/2014 | Lu ......................... H01L 29/785 438/294 |
| 2014/0070318 A1 | 3/2014 | Yu et al. | |
| 2014/0077229 A1 | 3/2014 | Liu et al. | |
| 2014/0117456 A1 | 5/2014 | Huang et al. | |
| 2014/0131776 A1 | 5/2014 | Ching et al. | |
| 2014/0197458 A1 | 7/2014 | Ching et al. | |
| 2014/0264279 A1 | 9/2014 | Cheng et al. | |
| 2015/0014788 A1 | 1/2015 | Park et al. | |
| 2015/0048417 A1* | 2/2015 | Kwok ................ H01L 29/7848 257/190 |
| 2016/0013316 A1 | 1/2016 | Kuang et al. | |
| 2016/0087104 A1 | 3/2016 | Lee et al. | |

FOREIGN PATENT DOCUMENTS

| | | |
|---|---|---|
| KR | 10-0668340 | 1/2007 |
| KR | 10-0853653 | 7/2008 |
| KR | 10-1085884 B1 | 11/2011 |
| KR | 10-2012-0038279 A | 4/2012 |
| KR | 10-2013-0088188 A | 8/2013 |

* cited by examiner

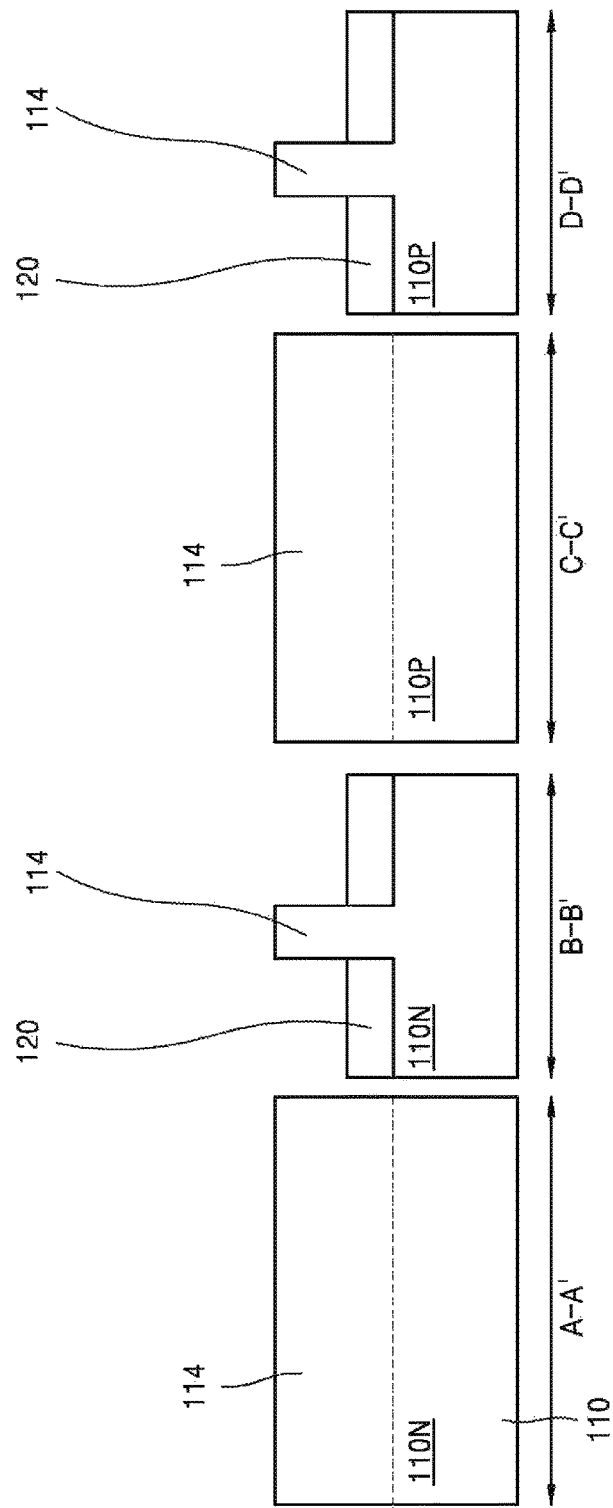

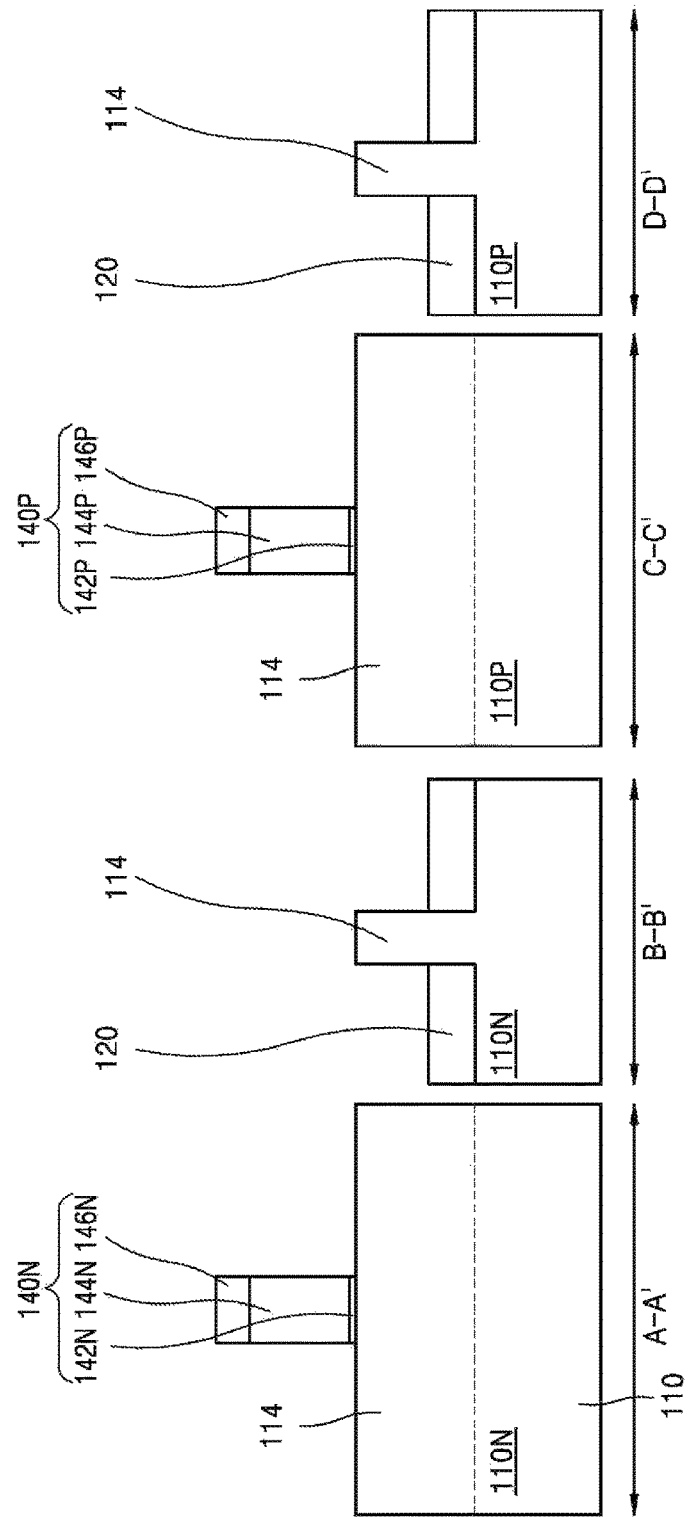

SEMICONDUCTOR DEVICE AND METHOD OF FABRICATING THE SAME

CROSS-REFERENCE TO RELATED APPLICATION

This application is a Continuation of U.S. patent application Ser. No. 14/861,794 which claims the benefit of Korean Patent Application No. 10-2014-0127189, filed on Sep. 23, 2014, in the Korean Intellectual Property Office, the disclosure of each of which is incorporated herein in its entirety by reference.

BACKGROUND

The present disclosure relates to a semiconductor device and a method of manufacturing the same, and more particularly, to a semiconductor device including a transistor and a method of manufacturing the same.

Increasing the speed of a semiconductor device included in an electronic device increases the speed of the electronic device. In semiconductor devices including transistors, contact resistance increases according to miniaturization of the semiconductor devices.

SUMMARY

The present disclosure provides a semiconductor device including a source/drain region having reduced resistance.

The present disclosure also provides a method of manufacturing a semiconductor device including a source/drain region having reduced resistance.

According to some examples, there is provided a semiconductor device, including a substrate comprised of an NMOS region and a PMOS region, and protrusion patterns. The semiconductor device may also comprise a first gate structure and a second gate structure respectively formed on the NMOS region and the PMOS region of the substrate, both of which cross the protrusion patterns and extend along a first direction that is parallel to an upper surface of the substrate. The semiconductor device may also comprise first source/drain regions formed on both sides of the first gate structure, and second source/drain regions are formed on both sides of the second gate structure. The semiconductor device may also comprise a first contact plug formed on each of the first source/drain regions, and a second contact plug formed on each of the second source/drain regions, wherein the first contact plugs and the second contact plugs are positioned unevenly. The first source/drain regions and the second source/drain regions may not have symmetric cross section shapes.

To give an example of the uneven positioning and non-symmetric cross section shapes of the source/drain regions, contact areas between each of the first contact plugs and the first source/drain regions may be less than contact areas between each of the second contact plugs and the second source/drain regions. Similarly, there may be differences in heights of the bottom surfaces and differences in heights of the contact landing surfaces of the contact plugs. Also, a maximum width of each of the second source/drain regions may be less than a maximum width of each of the first source/drain regions. Top portions of these source/drain regions may also be differently shaped. For example, they may extend flatly, be rounded, and/or be faceted at specified angles. Example embodiments of the semiconductor device may also vary in terms of the extent of a capping layer on side walls and uppermost surfaces of the source/drain regions. Other example embodiments of the semiconductor device may vary in terms of the number and position of spacers formed on side walls and upper surfaces of the gate structures, depending on their being on the first or second gate structure. One or more (e.g., only some or all) of the above features may be adopted in the semiconductor devices disclosed herein.

In some examples, a semiconductor device includes a substrate with a first protrusion pattern and a second protrusion pattern extending along a first direction, a first gate structure extending on the first protrusion pattern along a second direction that is different from the first direction and including a first gate insulating layer and a first gate electrode, which are sequentially stacked. The semiconductor device may also include a pair of first source/drain regions located at both sides, respectively, of the first gate structure along the first direction, a second gate structure extending on the second protrusion pattern along the second direction and including a second gate insulating layer and a second gate electrode, which are sequentially stacked. The semiconductor device may also include a pair of second source/drain regions located at both sides, respectively, of the second gate structure along the first direction, wherein an uppermost surface of at least one of the pair of first source/drain regions is lower than an uppermost surface of the pair of second source/drain regions.

In some examples a semiconductor device may include a substrate with a fin structure having a pair of channel regions and a recess located between the pair of channel regions is formed, a pair of gate structures respectively provided on the pair of channel regions and extending across the fin structure, and a source/drain region formed on a bottom surface of the recess. The source/drain region may include a first side wall extending from the bottom surface of the recess inclined at a first intersecting angle with respect to an upper surface of the substrate, a second side wall extending from an uppermost portion of the first side wall inclined at a second intersecting angle with respect to the upper surface of the substrate, and a first upper surface extending from an uppermost portion of the second side wall along a direction parallel to the upper surface of the substrate to the first side wall.

In some examples, a method of manufacturing a semiconductor device includes forming on a substrate a protrusion patterns extending along a first direction that are parallel to an upper surface of the substrate, forming a first gate structure and a second gate structure which cross the protrusion patterns on the substrate and extend along a second direction that is different from the first direction, forming a pair of first source/drain regions on both sides of the first gate structure, respectively, and forming a pair of second source/drain regions on both sides of the second gate structure, respectively, wherein the pair of first source/drain regions have upper surfaces higher than the upper surface of the substrate, and the pair of second source/drain regions have upper surfaces higher than the upper surface of the substrate. The method may also include removing a portion of the pair of first source/drain regions so that the upper surfaces of the pair of first source/drain regions are lower than the upper surfaces of the pair of second source/drain regions.

In some examples, a semiconductor device may comprise a substrate provided with a first fin shaped active region having a first conductivity and a second fin shaped active region having a second conductivity different than the first conductivity; a first gate structure crossing the first fin shaped active region; a second gate structure crossing the second fin shaped active region; a first recess formed in the first fin shaped active region to a side of the first gate structure; a second recess formed in the second fin shaped active region to a side of the second gate structure; a first epitaxial source/drain region formed in the first recess; and a second epitaxial source/drain region formed in the second recess. With respect to a first vertical cross sectional view of the first epitaxial source/drain region taken in a direction parallel to a lengthwise direction of the first gate structure and with respect to a second vertical cross sectional view of the second epitaxial source/drain region taken in a direction parallel to a lengthwise direction of the second gate structure, a maximum width of the first epitaxial source/drain region may be larger than a maximum width of the second epitaxial source/drain region and an uppermost surface of the first epitaxial source/drain region may comprise a curved surface.

A height of the uppermost surface of the first epitaxial source/drain region may be substantially equal to or less than a height of an uppermost surface of the second epitaxial source/drain region.

The uppermost surface of the second epitaxial source/drain region may be defined by one or more facet surfaces of the second epitaxial source/drain region.

The first epitaxial source/drain region may comprise first and second lower surfaces each comprising a corresponding downwardly facing facet surface of the first epitaxial source/drain region.

The first and second lower surfaces of the first epitaxial source/drain region may each comprise a planar surface lying at an angle with respect to an upper surface of the substrate within a range of 51° to 59°.

An insulating interlayer may be formed on the first epitaxial source/drain region and the second epitaxial source/drain region; a first contact hole may formed in the insulating interlayer and penetrating the first epitaxial source/drain region; and a second contact hole may be formed in the insulating interlayer and penetrating the second epitaxial source/drain region. A depth of penetration of the first contact hole in the first epitaxial source/drain region may be greater than a depth of penetration of the second contact hole in the second epitaxial source/drain region. A bottom surface of the first contact hole in the first epitaxial source/drain may be is lower than a bottom surface of the second contact hole in the second epitaxial source/drain region. First and second contact plugs may be formed in the first and second contact holes and the contact area of the first contact plug with the with the first epitaxial source/drain region may be greater than that of the second contact plug with the second epitaxial source/drain region.

A capping layer may be formed on and in contact with an uppermost surface of the second epitaxial source/drain region. No capping layer may be formed on and in contact with the uppermost surface of the first epitaxial source/drain region.

The second epitaxial source/drain may comprise SiGe doped with a dopant of the second conductivity type. The capping layer may comprise silicon doped with a dopant of the first conductivity type or un-doped silicon.

BRIEF DESCRIPTION OF THE DRAWINGS

Exemplary embodiments of the present disclosure will be more clearly understood from the following detailed description taken in conjunction with the accompanying drawings in which:

FIGS. 2A through 2L are cross-sectional views for describing a method of manufacturing a semiconductor device, according to an exemplary embodiment.

DETAILED DESCRIPTION OF THE EMBODIMENTS

Figure 1A:
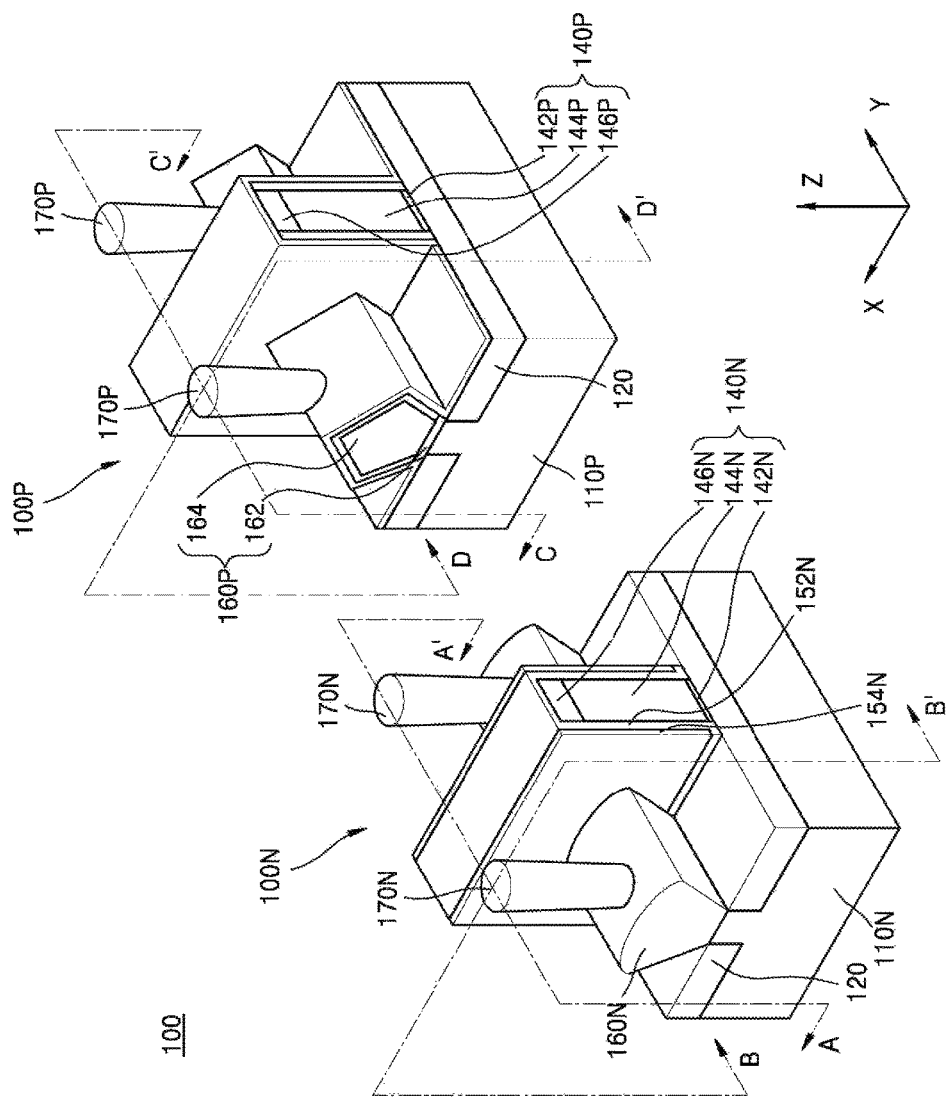
FIG. 1A is a perspective view of a semiconductor device according to an exemplary embodiment.

Exemplary embodiments now will be described more fully hereinafter with reference to the accompanying drawings, in which elements of the invention are shown. Although examples in the present disclosure are embodied in many different forms, the presently disclosed invention should not be construed as limited to the exemplary embodiments set forth herein. Rather, these embodiments are provided so that this disclosure will be thorough and complete, and will fully convey the scope of examples of the inventive concept to one of ordinary skill in the art. In the drawings, the thicknesses of layers and regions and the sizes of components may be exaggerated for clarity. Like reference numerals refer to like elements throughout.

It will be understood that when an element, such as a layer, a region, or a substrate, is referred to as being "on,"

"connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.)

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments.

As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which exemplary embodiments belong.

Hereinafter, exemplary embodiments will be described in detail.

FIG. 1A is a perspective view of a semiconductor device 100 according to an exemplary embodiment.

Figure 1B:
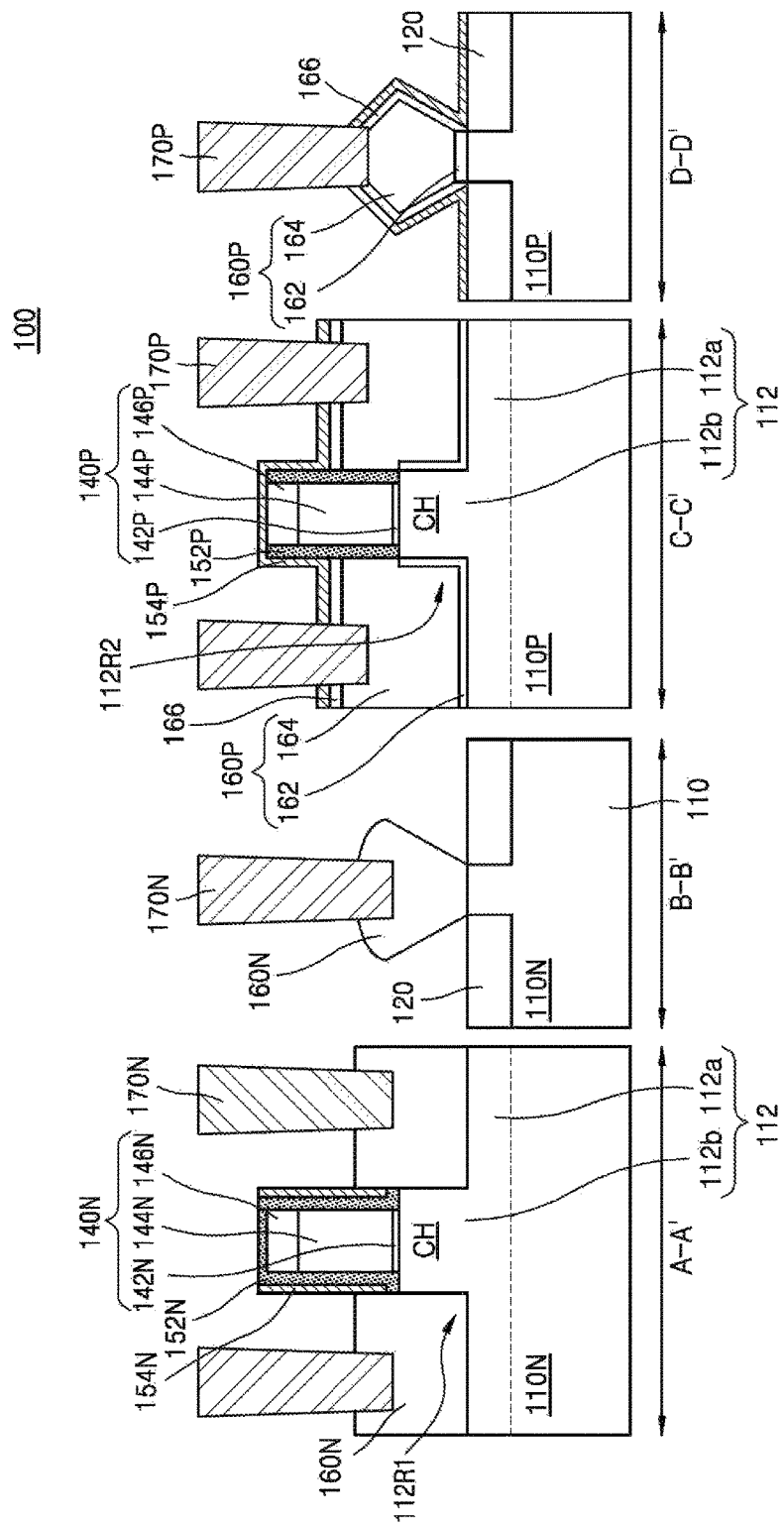
FIG. 1B is a cross-sectional view of a semiconductor device according to an exemplary embodiment.

FIG. 1B is a cross-sectional view of the semiconductor device 100. FIG. 1B illustrates cross-sectional planes respectively taken along lines A-A', B-B', C-C', and D-D' of FIG. 1A.

Figure 1C:
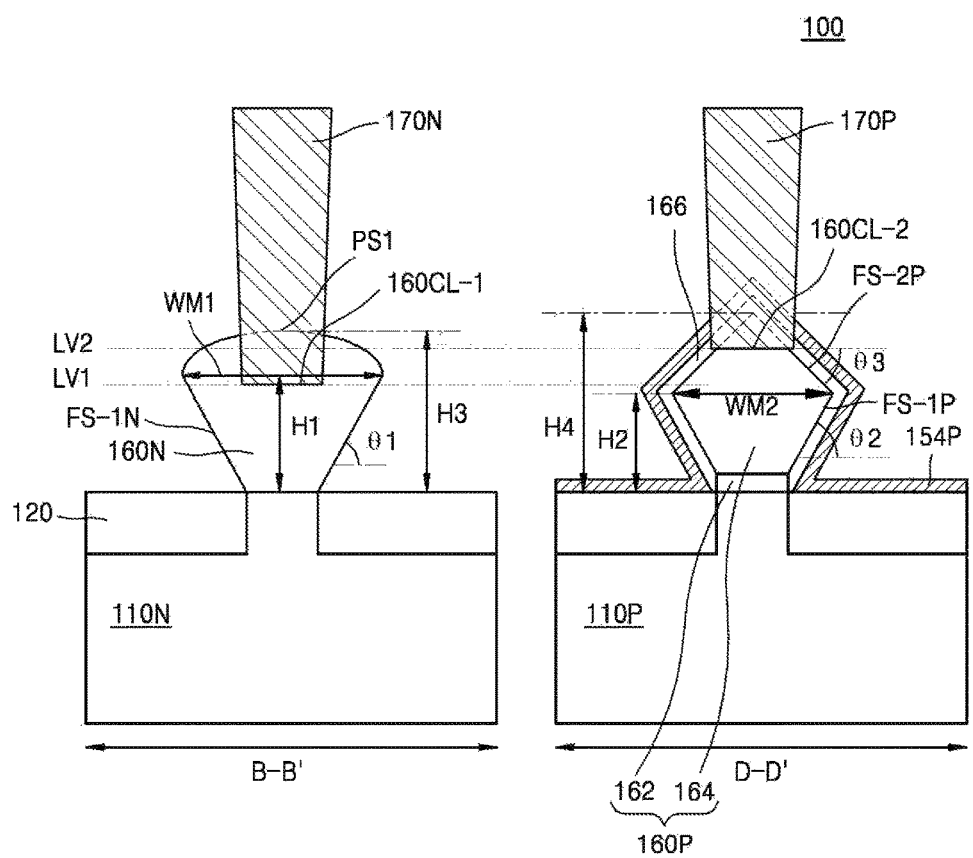
FIG. 1C is an enlarged cross-sectional view of a semiconductor device according to an exemplary embodiment.

FIG. 1C is a cross-sectional view of the semiconductor device 100. In particular, FIG. 1C is an enlarged cross-sectional view taken along lines B-B' and C-C' of FIG. 1A.

Referring to FIGS. 1A, 1B, and 1C, the semiconductor device 100 may include an NMOS transistor 100N and a PMOS transistor 100P.

An NMOS region 110N and a PMOS region 110P spaced apart from each other by a device separating pattern (e.g., an isolation pattern, such as a trench isolation pattern) (not shown) may be defined on the substrate 110. The NMOS transistor 100N may be formed in the NMOS region 110N and the PMOS transistor 100P may be formed in the PMOS region 110P. The NMOS region 110N and the PMOS region 110P may each comprise one or more active regions. The NMOS transistor 100N may include a first gate structure 140N and a first source/drain region 160N, and the PMOS transistor 100P may include a second gate structure 140P and a second source/drain region 160P.

With reference to FIGS. 1A-1C, and the like, descriptions are made on the basis of source/drain regions 160N and 160P in the example embodiments. It will be understood that each of the described source/drain regions may act as a source or a drain for an associated transistor in dependence on the operation of the transistor.

A channel region CH may be defined in the NMOS region 110N of the substrate 110. A pair of first source/drain regions 160N may be located respectively on both sides of the channel region CH on the substrate 110 along a first direction (for example, direction Y of FIG. 1). The first gate structure 140N may extend on the channel region CH along a second direction (for example, direction X of FIG. 1A), which is different from the first direction (direction Y).

A channel region CH may be defined in the PMOS region 110P of the substrate 110. A pair of second source/drain regions 160P may be located respectively on both sides of the channel region CH on the substrate 110 (which, in this example, is also along the first direction—direction Y of FIG. 1A). The second gate structure 140P may extend on the channel region CH (which, in this example, is also along the second direction—direction X of FIG. 1A. It should be noted that the channel regions CH for the PMOS and NMOS transistors may have different charge carrier dopants.

Figure 3A:
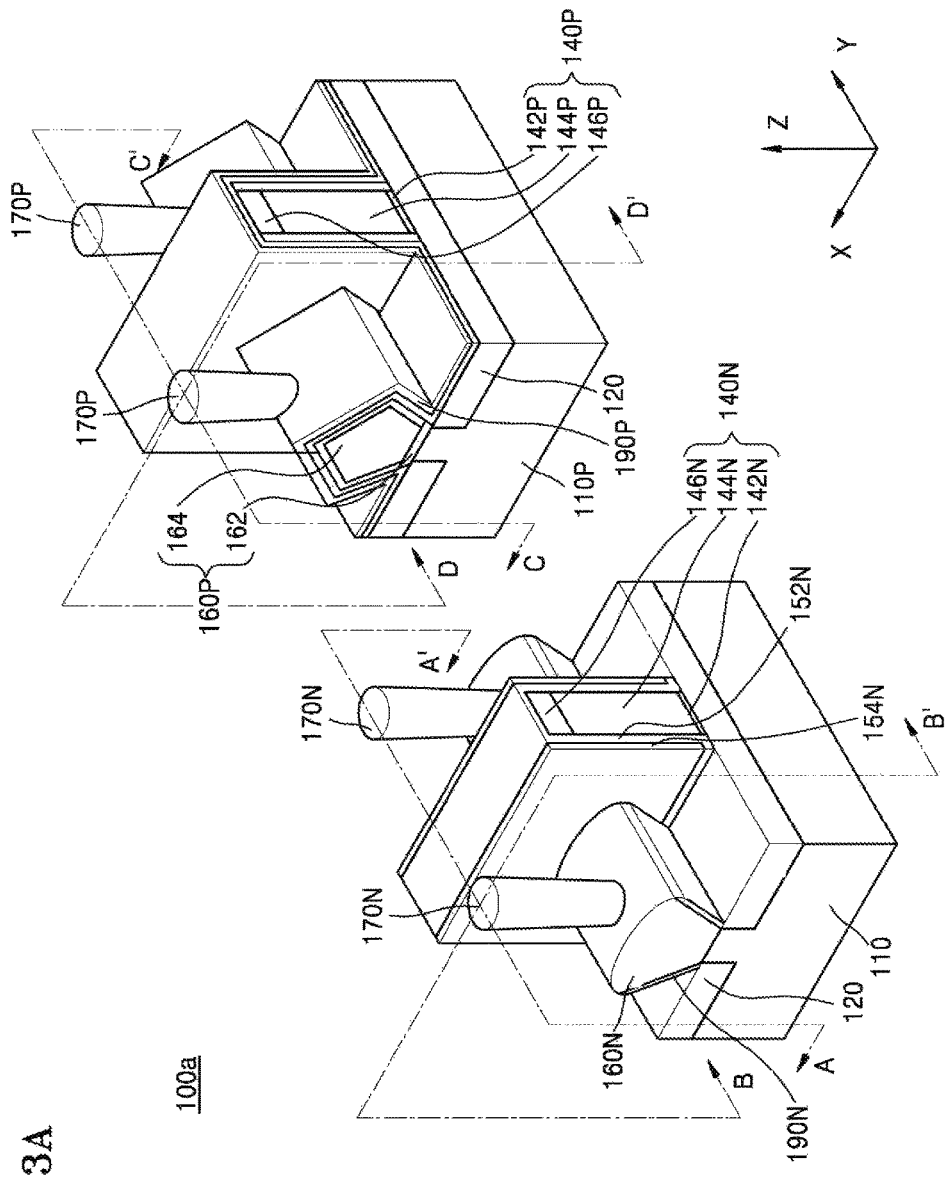
FIG. 3A is a perspective view of a semiconductor device according to an exemplary embodiment.

Although FIGS. 1A, 3A, and the like, illustrate that the first and second gate structures (for example, 140N and 140P) extend along the same direction, the direction along which the first and second gate structures extend is not limited thereto. In other exemplary embodiments, the first gate structure may extend along the first direction and the second gate structure may extend along the second direction.

Fin structures 112 having a channel region CH and a pair of recesses (112R1 or 112R2) located at both sides of the channel region CH may be formed on the substrate 110. A first pair of source/drain regions 160N may be formed in the pair of recesses 112R1 and a second pair of source/drain regions 160P may be formed in the pair of recesses 112R2. Each of the fin structures 112 may include a base portion 112a and a protrusion portion 112b in which the channel region CH is formed. Each of the fin structure 112 may be a portion formed on the substrate 110 by a selective epitaxial growth (SEG) growth method or a portion that is formed by removing a portion of the substrate 110. An isolation layer 120 may be formed around the base portion 112a of the fin structures 112. Each of the fin structures 112 may be an active region for realizing a transistor.

The first gate structure 140N may include a first gate electrode 144N provided on the channel region CH and extending along the second direction (direction X), a first gate insulating layer 142N arranged between the channel region CH and the first gate electrode 144N, and a first gate mask 146N formed on the first gate electrode 144N.

The second gate structure 140P may include a second gate electrode 144P provided on the channel region CH and extending along the second direction (direction X), a gate insulating layer 142P arranged between the channel region CH and the second gate electrode 144P, and a second gate mask 146P formed on the second gate electrode 144P.

A first spacer 152N and a third spacer 154N may be sequentially stacked on a side wall of the first gate structure 140N, and a second spacer 152P and a fourth spacer 154P may be sequentially stacked on a side wall of the second gate structure 140P.

According to an exemplary embodiment, the first spacer 152N may be conformally formed on an upper surface and side walls of the first gate structure 140N. The third spacer 154N may be formed on side walls of the first gate structure 140N, and the first spacer 152N may be interposed between the first gate structure 140N and the third spacer 154N. The third spacer 154N may not be formed on the upper surface of the first gate structure 140N.

According to an exemplary embodiment, the second spacer 152P may be formed on side walls of the second gate structure 140P. The fourth spacer 154P may be formed on side walls and an upper surface of the second gate structure 140P. The second spacer 152P may be interposed between the side walls of the second gate structure 140P and the fourth spacer 154P, and the upper surface of the second gate structure 140P may directly contact a bottom surface of the fourth spacer 154P. The second spacer 154P may not be formed on the upper surface of the second gate structure 140P.

The first source/drain region 160N may contact a side surface of the channel region CH and at least a portion of a side surface of the third spacer 154N. The first source/drain region 160N may be formed on the recess 112R1 and may extend below a bottom surface of the third spacer 154N.

As shown in FIG. 1C, the first source/drain region 160N may include first side walls FS-1N extending from the base portion 112a of the fin structure 112 that are inclined at a first intersecting angle θ1 with respect to an upper surface of the substrate 110, and a first upper surface PS1 extending between uppermost portions of the first side walls FS-1N.

According to an exemplary embodiment, each of the first side walls FS-1N of the first source/drain region 160N may be a faceted side wall, which is generated since facet surfaces according to a specific crystallographic orientation are grown in a silicon epitaxial growth process. For example, facet surfaces parallel with a crystallographic plane {111} (e.g., including (111), (−111), (1-11), and (11-1) planes) of a silicon crystal may be grown, and thus, the first side walls FS-1N may be arranged in a direction parallel with the plane {111}. According to an exemplary embodiment, the first intersecting angle θ1 may be in a range of about 51° to about 59°. In some examples, the first intersecting angle θ1 may be in a range of about 54° to about 57°.

According to an exemplary embodiment, a top surface (e.g., the first upper surface PS1) of the first source/drain region 160N may have a rounded shape. For example, a shape of the source/drain region 160N may be such that it grows outwardly, in terms of its width, at the intersecting angle θ1 in a third direction upwardly (direction Z) from the base portion 112a of the fin structure 112 until reaching a point of a first maximum width WM1. At the first maximum width WM1 the upper surface PS1 curves inward to reach a maximum height where the surface becomes substantially flat. The bottom portion of the source/drain region 160N may have a cross sectional shape (e.g., as shown in FIG. 1C) of an inverted trapezoid below a location of its maximum width with respect to the cross section and a cross sectional shape of curved upper surface (e.g., approximating a segment of a circle) above a location of its maximum width with respect to the cross section. An upper most portion of the first upper surface PS1 of the first source/drain region 160N may linearly extend along a direction (for example, direction Y) substantially parallel with the upper surface of the substrate 110.

According to an exemplary embodiment, the first source/drain region 160N may include silicon (Si) or silicon germanium (SiGe). For example, the first source/drain region 160N may substantially consist of silicon or silicon germanium and charge carrier dopants, such as carbon (C), boron (B), and/or phosphorous (P).

The second source/drain region 160P may contact a side surface of the channel region CH and at least a portion of a side surface of the second spacer 152P. The second source/drain region 160P may be formed on the recess 11282 and may extend below a bottom surface of the second spacer 152P. Also, the material layer of the fourth spacer 154P may extend horizontally from the side wall of the second gate structure 140P to cover the second source/drain region 160P.

The second source/drain region 160P may include second side walls FS-1P extending from the base portion 112a of the fin structure 112 that are inclined at a second intersecting angle θ2 with respect to the upper surface of the substrate 110, and third side walls FS-2P extending from an uppermost portion of the second side wall FS-1P that are inclined at a third intersecting angle θ3 with respect to the upper surface of the substrate 110.

According to an exemplary embodiment, each of the second side walls FS-1P and the third side walls FS-2P of the second source/drain region 160P may be faceted side walls, which are generated since facet surfaces according to a specific crystallographic orientation are grown in a silicon epitaxial growth process. According to an exemplary embodiment, the second intersecting angle θ2 and the third intersecting angle θ3 may be in a range of about 51° to about 59°. For example, the second intersecting angle θ2 and the third intersecting angle θ3 may be in a range of about 54° to about 57°.

According to an exemplary embodiment, the second source/drain region 160P may include a first strain inducing layer 162 and a second strain inducing layer 164.

The first strain inducing layer 162 may be formed on a side of the protrusion portion 112b and on the base portion 112a of the fin structure 112 at a controlled thickness in the recess 112R2, and the second strain inducing layer 164 may fill the recess 112R2 above the first strain inducing layer 162. The first strain inducing layer 162 may be arranged between the channel region CH below the second gate structure 140P and the second strain inducing layer 164 which may prevent the second strain inducing layer 164 and the channel region CH from directly contacting each other.

For example, in FIG. 1B the first strain inducing layer 162 is integrally arranged between the second strain inducing layer 164 and the side surface of the channel region CH and between a bottom surface of the second strain inducing layer 164 and the substrate 110. In an alternative embodiment, the first strain inducing layer 162 may be arranged only between the second strain inducing layer 164 and the side surface of the channel region CH (e.g., the first strain inducing layer 162 may be only on the sidewalls of the fin structure 112 and not on the bottom surface of the recess 112R2).

The second strain inducing layer 164 and the channel region CH may respectively have a first conductivity type and a second conductivity type that are different from each other. For example, the second strain inducing layer 164 and the channel region CH may be p-type and n-type semiconductor materials, respectively.

The channel region CH may consist essentially of, for example, silicon or silicon germanium, and charge carrier impurities. The first and second strain inducing layers 162 and 164 may consist essentially of, for example, silicon germanium.

The first and second strain inducing layers 162 and 164 may include a first germanium content and second germanium content, respectively. In example embodiments, the germanium content denotes a proportion or percentage of germanium atoms against the total number of silicon and germanium atoms, when the first and second strain inducing layers 162 and 164 include silicon germanium. The first germanium content of the first strain inducing layer 162 may be greater than the second germanium content of the second strain inducing layer 164. Alternatively, the first germanium content of the first strain inducing layer 162 may be less than or the same as the second germanium content of the second strain inducing layer 164. The germanium content of the channel region CH may be less than (including none) the first germanium content of the first strain inducing layer 162, and the germanium content of the channel region CH may be less than the second germanium content of the second strain inducing layer 164. That is, the germanium content of the channel region CH may be 0, or a positive value less than the first germanium content and the second germanium content.

The first strain inducing layer 162 and the second strain inducing layer 164 may have a first doping concentration and a second doping concentration, respectively. In example embodiments, the second doping concentration of the second strain inducing layer 164 may be greater than the first doping concentration of the first strain inducing layer 162. The first strain inducing layer 162 may have a first conductive type or may be substantially un-doped. In certain embodiments, the first doping concentration of the first strain inducing layer 162 may be substantially 0 or lower than the second doping concentration. The first strain inducing layer 162 may prevent a dopant for the first conductive type, included in the second strain inducing layer 164, from spreading to the channel region CH which has the second conductive type. The second strain inducing layer 164 may be doped with boron (B) as the dopant.

A source/drain capping layer 166 may be formed on the second source/drain region 160P. The source/drain capping layer 166 may cover an outer surface of the second strain inducing layer 164 except for surface portions contacting with the side surface of the channel region CH or the first strain inducing layer 162. The source/drain capping layer 166 may include, for example, silicon doped with a dopant for a first conductive type or un-doped silicon. The source/drain capping layer 166 may have an etch selectivity with respect to the first strain inducing layer 162 such that certain etchants etch the capping layer 166 slower than the first strain inducing layer 162.

With respect to widths of the first source/drain region 160N along the second direction (direction X) horizontal with the substrate 110, the first source/drain region 160N may have a first maximum width WM1. A height at a point in which the first source/drain region 160N has the first maximum width WM1 (i.e., along a third direction (direction Z) perpendicular to the substrate 110) may be a first height H1. The second source/drain region 160P may have a second maximum width WM2 along the second direction (direction X). A height at a point in which the second source/drain region 160P has the second maximum width WM2, along the third direction, may be defined as a second height H2.

According to an exemplary embodiment, the first maximum width WM1 of the first source/drain region 160N may be greater than or the same as the second maximum width WM2 of the second source/drain region 160P. For example, the first source/drain region 160N may have the first maximum width WM1 at an uppermost portion of the first side walls FS-1N, and the second source/drain region 160P may have the second maximum width WM2 where the second side walls FS-1P and the third side walls FS-2P meet. Also, since the first through third side walls FS-1N, FS-1P, and FS-2P may be faceted side walls which are inclined at angles (for example, the first through third side walls FS-1N, FS-1P, and FS-2P have the first through third intersecting angles θ1, θ2, and θ3, respectively, with respect to the upper surface of the substrate 110), the first and second heights H1 and H2 may also increase when the first and second maximum widths WM1 and WM2 increase. According to an exemplary embodiment, the uppermost portion of the first side walls FS-1N of the first source/drain region 160N may be higher than an uppermost portion of the second side walls FS-1P of the second source/drain region 160P. Accordingly, the first maximum width WM1 of the first source/drain region 160N may be greater than the second maximum width WM2 of the second source/drain region 160P.

The first source/drain region 160N may have a third height H3 along the third direction and the second source/drain region 160P may have a fourth height H4 along the third direction. Here, the third and fourth heights H3 and H4 refer to a height from a bottom surface to an uppermost surface of the first source/drain region 160N and a height from a bottom surface to an uppermost surface of the second source/drain region 160P, respectively. According to an exemplary embodiment, the third height H3 of the first source/drain region 160N may be less than or the same as the fourth height H4 of the second source/drain region 160P.

A first contact plug 170N and a second contact plug 170P may be formed on the first source/drain region 160N and the second source/drain region 160P, respectively. The second contact plug 170P may contact at least a portion of the fourth spacer 154P. According to an exemplary embodiment, a bottom surface of the first contact plug 170N may be lower than a bottom surface of the second contact plug 170P. For example, as illustrated in FIG. 1C, the bottom surface of the first contact plug 170N may be located at a first level LV1 and the bottom surface of the second contact plug 170P may be located at a second level LV2, which is higher than the first level LV1.

An upper surface portion of the first source/drain region 160N, which contacts the first contact plug 170N, is referred to as a first contact landing surface 160CL-1, and an upper surface portion of the second source/drain region 160P, which contacts the second contact plug 170P, is referred to as a second contact landing surface 160CL-2. The first contact landing surface 160CL-1 may be lower than the second contact landing surface 160CL-2. As illustrated in FIG. 1C, the first contact landing surface 160CL-1 may be located at a level substantially the same as the first level LV1 and the second contact landing surface 160CL-2 may be located at a level substantially the same as the second level LV2.

In certain embodiments where the first maximum width WM1 of the first source/drain region 160N is greater than the second maximum width WM2 of the second source/drain region 160P and the first contact landing surface 160CL-1 of the first source/drain region 160N is lower than the second contact landing surface 160CL-2 of the second source/drain region 160P, a contact area between the first contact plug 170N and the first source/drain region 160N may be greater than a contact area between the second contact plug 170P and the second source/drain region 160P. Thus, when the contact area between the first source/drain region 160N and the first contact plug 170N is relatively great, the resistance between the first source/drain region 160N and the first contact plug 170N may be decreased.

The resistance between the second source/drain region 160P and the second contact plug 170P may include the contact resistance between the second source/drain region 160P and the second contact plug 170P and the resistance of the strained second source/drain region 160P. When the second contact landing surface 160CL-2 of the second source/drain region 160P is higher than the first contact landing surface 160CL-1 of the first source/drain region 160N, a volume of the second contact plug 170P located inside of the second source/drain region 160P may be decreased (as compared to the situation when the second contact plug 170P is positioned to a depth of the first contact landing surface 160CL-1). (For example, a volume of a portion of the second source/drain region 160P, which is etched away to position the second contact plug 170P therein, may be decreased.) Accordingly, a strain decrease due to a volume decrease of the second source/drain region 160P may be prevented. Also, the resistance due to the strain generated in the second source/drain region 160P may be kept from increasing so that the resistance between the second source/drain region 160P and the second contact plug 170P may be comparatively reduced.

FIGS. 2A through 2L are cross-sectional views for describing a method of manufacturing a semiconductor device, according to an exemplary embodiment. The method described with reference to FIGS. 2A through 2L may correspond to a method of manufacturing the semiconductor device 100 described with reference to FIGS. 1A through 1C. FIGS. 2A through 2L illustrate cross-sectional planes taken along lines A-A', B-B', C-C', and D-D' of FIG. 1A, for describing exemplary processes of manufacturing the semiconductor device 100.

Figure 2A:
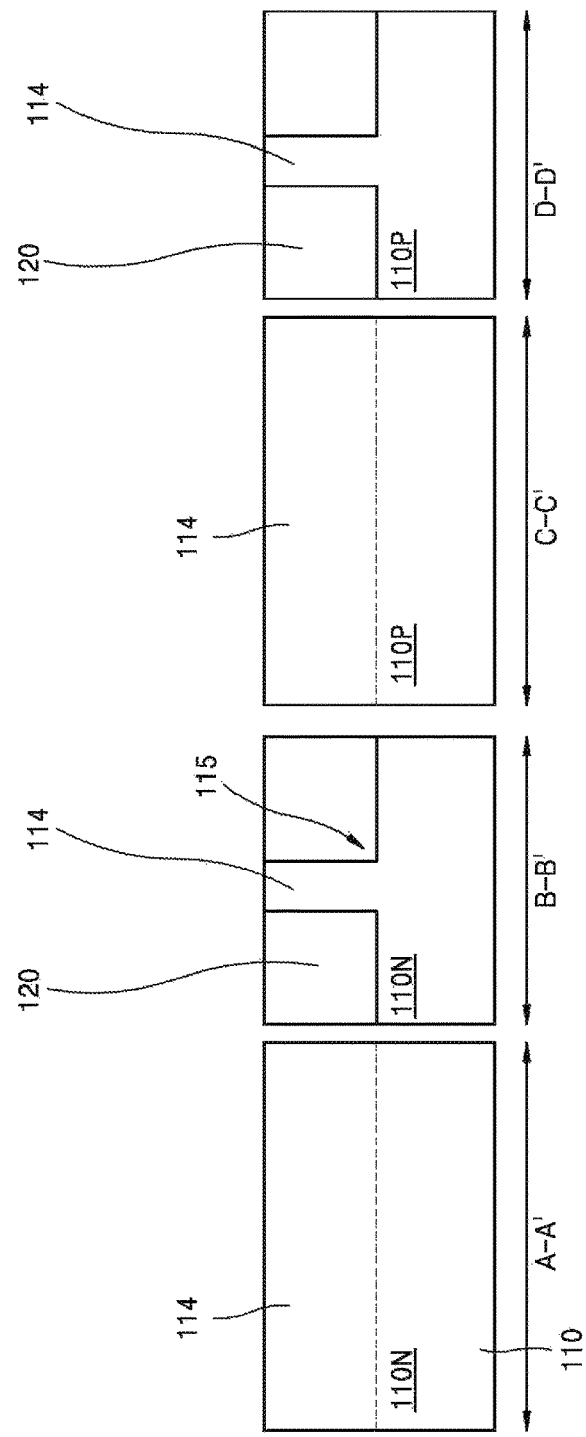

Referring to FIG. 2A, the substrate 110 provided with a protrusion pattern 114 extending along the first direction (direction Y) is prepared. Trenches 115 may be formed at both sides of the protrusion pattern 114. The substrate 110 may include, for example, silicon. Alternatively, the substrate 110 may include a semiconductor element, such as germanium, or a compound semiconductor, such as silicon carbide, gallium arsenide, indium arsenide, or indium phosphide. Alternatively, the substrate 110 may have a silicon-on-insulator (SOI) structure. For example, the substrate 110 may include a buried oxide (BOX) layer. The substrate 110 may include a conductive area, for example, a well doped with impurities or a structure doped with impurities.

After a first mask pattern (not shown) is formed on the substrate 110, an etching process which uses the first mask pattern as an etch mask may be performed, in order to etch trenches 115 and thereby form the protrusion pattern 114. The first mask pattern may have a linear shaped openings extending along the first direction (direction Y). The first mask pattern may be formed of a material including at least one selected from, for example, a silicon oxide layer, a silicon nitride layer, and a silicon oxynitride layer. The protrusion pattern 114 may be formed of, for example, silicon (Si) or silicon germanium (SiGe).

Then, the isolation layer 120 filling the trench 115 is formed. The isolation layer 120 may be formed of a material including at least one selected from, for example, a silicon oxide layer, a silicon nitride layer, and a silicon oxynitride layer. A preliminary isolation material (not shown) covering the protrusion pattern 114 is formed on the substrate 110, and then, the isolation layer 120 may be formed by removing a portion of the preliminary isolation material until the first mask pattern is exposed. Alternatively, the isolation layer 120 may be formed by removing a portion of the preliminary isolation material and the first mask pattern until the protrusion pattern 114 is exposed. To remove the portion of the preliminary isolation material, an etch-back process, a chemical mechanical polishing (CMP) process, or both thereof may be performed.

The first mask pattern may be removed after the isolation layer 120 is formed. However, the first mask pattern may also be removed after an upper portion of the isolation layer 120 is removed.

Referring to FIG. 2B, the isolation layer 120 may be formed such that an upper portion of the protrusion pattern 114 is exposed and a lower portion of the protrusion pattern 114 is covered, by removing a portion of the isolation layer 120. To form the isolation layer 120, an etching process having an etch selectivity with respect to the protrusion pattern 114 may be performed.

The first mask pattern may alternatively be removed in the same step as when the isolation layer 120 is formed, and the first mask pattern may also be removed when the upper portion of the isolation layer 120 is removed, or after the upper portion of the isolation layer 120 is removed.

Alternatively, the protrusion pattern 114 provided with substrate 110 may be formed by selective epitaxial growth of the protrusion pattern 114. For example, an insulation layer (which may be isolation layer 120) may be deposited on substrate 110 and patterned to form openings exposing the substrate 110. A selective epitaxial growth (SEG) process may be performed to epitaxially grow the protrusion patterns 114 within the openings using the substrate as a seed layer. In-situ doping to form the channel region may be performed during this SEG process. The isolation layer 120 may be etched back so that the protrusion patterns 114 extend above the lowered upper surface of the isolation layer 120.

Doping for forming a channel region may be performed on the protrusion pattern 114. For example, phosphorous (P) or arsenic (As) may be implanted onto the protrusion pattern 114 of the PMOS region 110P, as a dopant for forming a channel region. Also, boron (B) may be implanted into the protrusion pattern 114 of the NMOS region 110N as the dopant for forming a channel region. The doping for forming a channel region may be performed among the processes illustrated in FIGS. 2A and 2B.

According to an exemplary embodiment, after a first blocking layer (not shown) covering the NMOS region 110N of the substrate 110 is formed, the doping for forming a channel region may be performed on the protrusion pattern 114 of the PMOS region 110P of the substrate 110, and then the first blocking layer may be removed. Then, after a second blocking layer (not shown) covering the PMOS region 110P of the substrate 110 is formed, the doping for forming a channel region may be performed on the protrusion pattern 114 of the NMOS region 110N of the substrate 110, and then the second blocking layer may be removed. In other embodiments, the order in which the PMOS region 110P and the NMOS region 110N are doped may vary.

Referring to FIG. 2C, after an insulating layer (not shown) and a conductive layer (not shown) are sequentially formed on the substrate 110, first and second gate masks 146N and 146P extending along the second direction (direction X) that is different from the first direction (direction Y) may be formed on the conductive layer.

The first gate insulating layer 142N and the first gate electrode 144N sequentially stacked below the first gate mask 146N may be formed and the second gate insulating layer 142P and the second gate electrode 144P sequentially stacked below the second gate mask 146P may be formed, by sequentially etching the conductive layer and the insulating layer by using the first and second gate masks 146N and 146P as etch masks.

Accordingly, the first gate structure 140N including the first gate insulating layer 142N, the first gate electrode 144N, and the first gate mask 146N sequentially stacked on the substrate 110, and the second gate structure 140P including the second gate insulating layer 142P, the second gate electrode 144P, and the second gate mask 146P sequentially stacked on the substrate 110 may be formed. The first and second gate electrodes 144N and 144P may be arranged to cross the protrusion pattern 114, and the first and second gate insulating layers 142N and 142P may be interposed between the protrusion pattern 114, and the first and second gate electrodes 144N and 144P.

The first and second gate masks 146N and 146P may be formed of a material including at least one selected from, for example, a silicon oxide layer, a silicon nitride layer, and a silicon oxynitride layer. The first and second gate masks 146N and 146P may function as a gate capping layer.

Figure 2D:
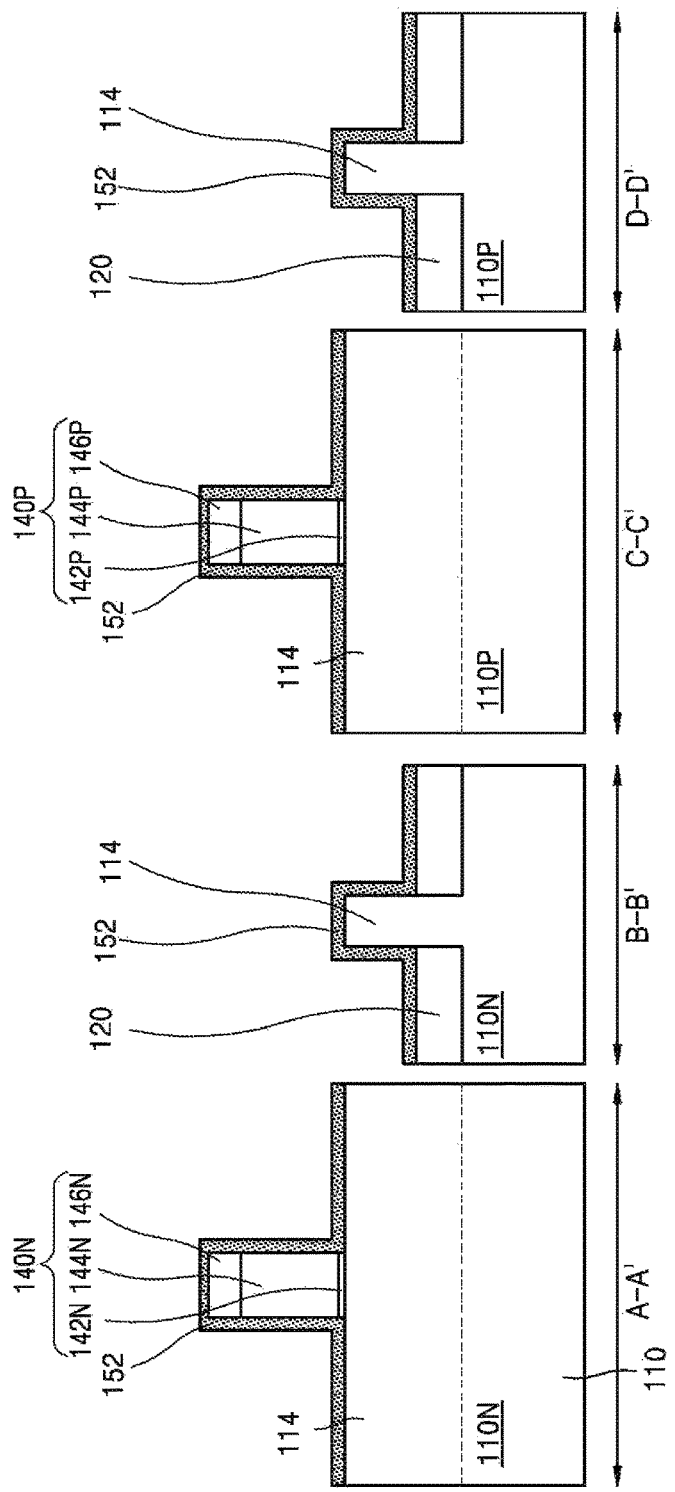

Referring to FIG. 2D, a preliminary first spacer layer 152 covering the first and second gate structures 140N and 140P may be formed on the substrate 110. The preliminary first spacer layer 152 may be formed by using, for example, a silicon nitride layer or a silicon oxynitride layer.

After the preliminary first spacer layer 152 is formed, an ion implantation process may be performed on the protrusion pattern 114 to implant impurity ions onto extension portions (not shown) of the first source/drain region 160N and the second source/drain region 160P, which are to be formed in a sequential process. The extension portions may be impurity diffusion regions of the source/drain regions 160N, 160P that extend the source/drain region to locations underneath the corresponding gate structure 140N, 140P. A heat annealing or laser annealing process may be optionally performed after the ion implantation process and may cause the implanted impurities on either side of the gate structures 140N, 140P to diffuse to locations under the gate structures 140N, 140P so that the boundaries of the source/drain exists under the gate structures 140N, 140P.

In another embodiment, the ion implantation process may be performed directly on the protrusion pattern 114 before the preliminary first spacer layer 152 is formed.

Figure 2E:
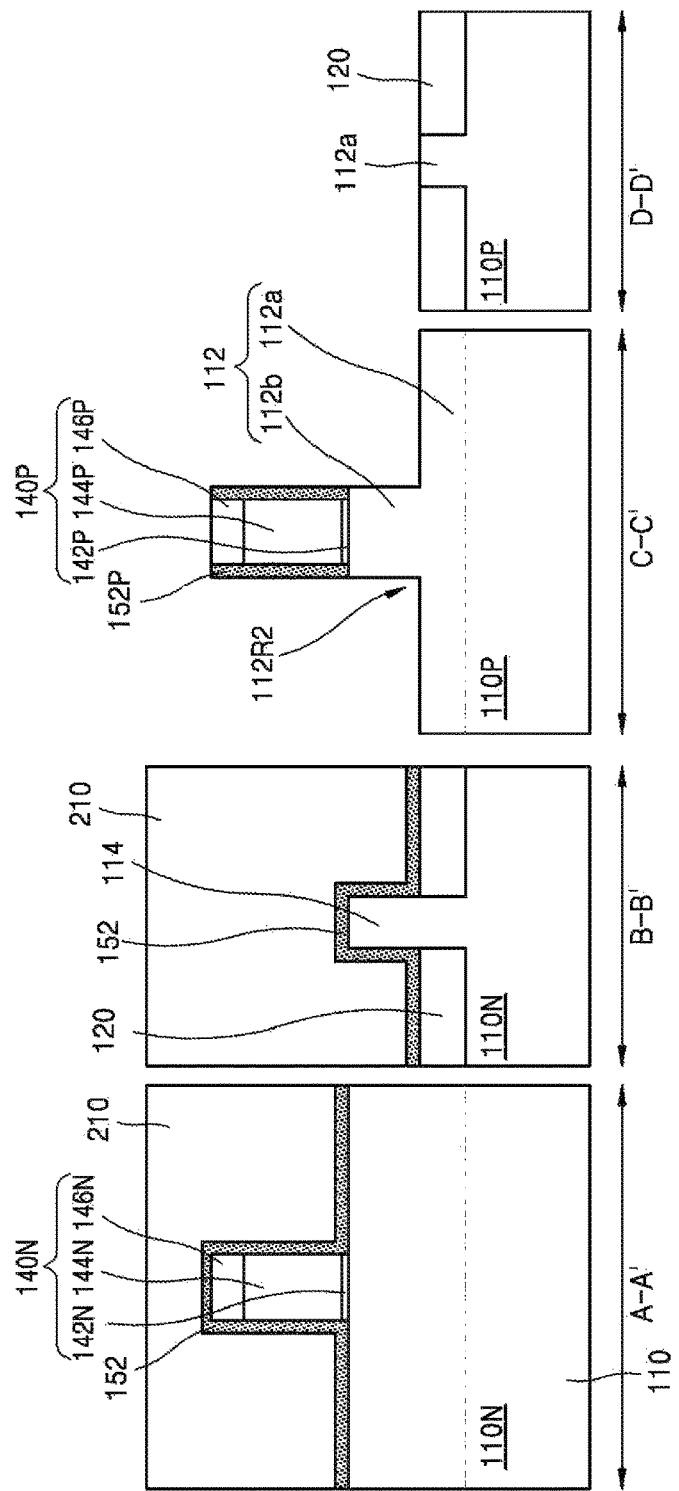

Referring to FIG. 2E, a first blocking layer 210 covering the NMOS region 110N of the substrate 110 may be formed. An anisotropic etching process may be performed on the preliminary first spacer layer 152 (refer to FIG. 2D) exposed on the PMOS region 110P of the substrate 110 using the gate structure 140P as a mask, in order to form the fin structure 112 having the protrusion portion 112b and the pair of recesses 112R2 located at both sides of the protrusion portion 112b.

As illustrated in FIG. 2E, the etching process may be performed until an upper surface of the protrusion pattern 114 located at both sides of the second gate structure 140P is located at a level substantially the same as or similar to a level of an upper surface of the isolation layer 120. Thus, the pair of recesses 112R2 are formed since portions of the protrusion pattern 114 (at both sides of the second gate structure 140P) are removed. Also, a portion of the protrusion pattern 114, which remains between the pair of recesses 112R2, may be the protrusion portion 112b. The fin structure 112 may include the base portion 112a, which is located below the protrusion portion 112b and corresponds to a bottom surface portion of the pair of recesses 112R2, and the protrusion portion 112b arranged on the base portion 112a. A side wall of the protrusion portion 112b and an upper surface of the base portion 112a may be exposed by the anisotropic etching process.

A portion of the preliminary first spacer layer 152, which is located on a side wall of the second gate structure 140P, may not be removed by the anisotropic etching process, and may remain so as to become the second spacer 152P.

According to an exemplary embodiment, the preliminary first spacer layer 152 may be formed by using a material having an etch selectivity with respect to the second gate mask 146P, and a portion of the second gate mask 146P, which is exposed when the preliminary first spacer layer 152 is etched during the anisotropic etching process, may not be removed. When an upper portion of the protrusion pattern 114 is partially removed, an upper portion of the preliminary first spacer layer 152 located on the side wall of the second gate structure 140P may also be partially removed. In this case, unlike the illustration of FIG. 2E, an upper surface of the second spacer 152P may be a little lower than an upper surface of the second gate mask 146P.

Then, the first blocking layer 210 may be removed.

Figure 2F:
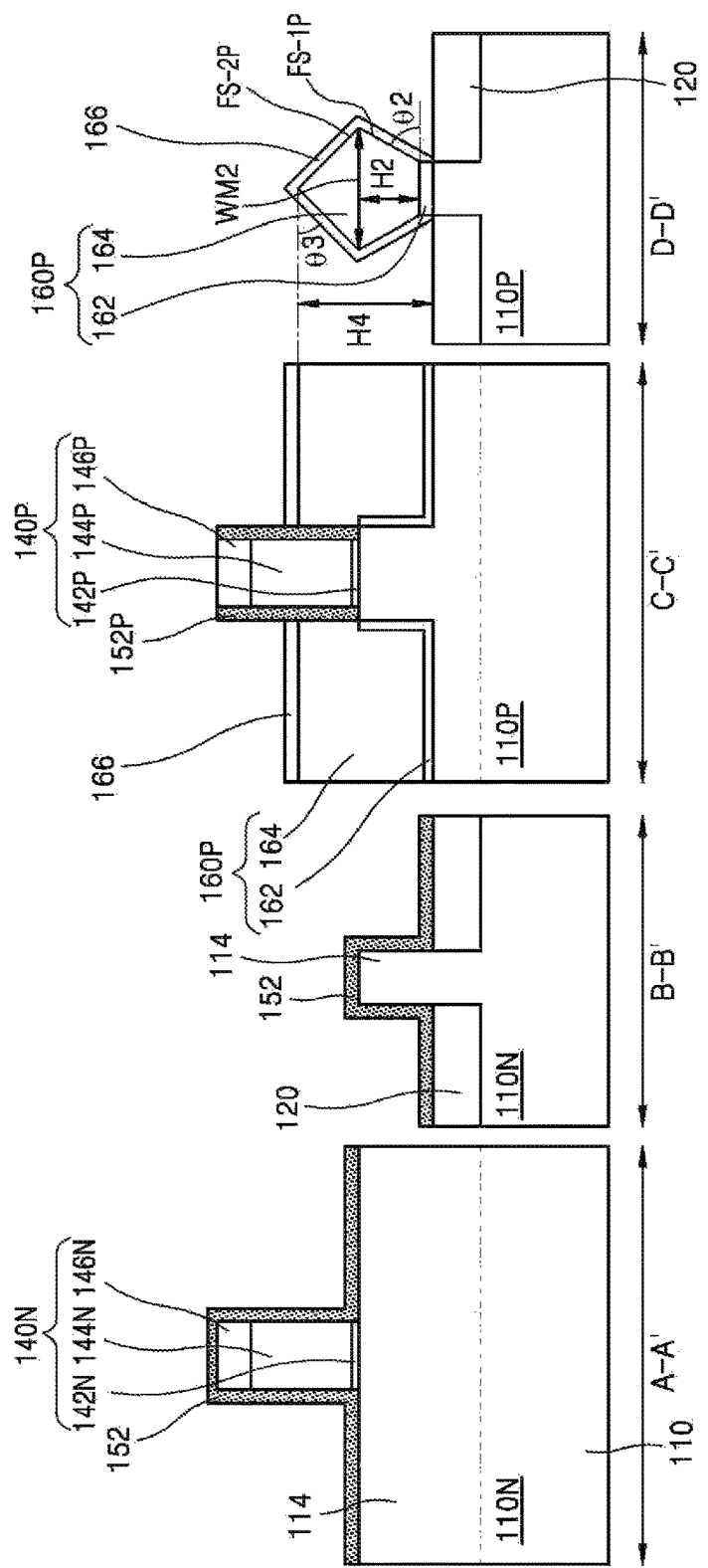

Referring to FIG. 2F, the second source/drain region 160P may be formed by forming the first strain inducing layer 162 and the second strain inducing layer 164 on the exposed surface of the fin structure 112, that is, the upper surface of the base portion 112a and the side surface of the protrusion portion 112b, which are exposed by the recess 112R2.

According to an exemplary embodiment, the first strain inducing layer 162 may be formed by using a semiconductor material including Ge. For example, the first strain inducing layer 162 may be un-doped silicon germanium (SiGe). For example, the first strain inducing layer 162 may have Ge content of about 10% to about 30%, or of about 10% to about 80%. The second strain inducing layer 164 may be formed by using an un-doped semiconductor material, for example, Si. The first strain inducing layer 162 may be formed by an SEG method using the fin structure 112 as a seed. The second strain inducing layer 164 may be formed by an SEG method using the first strain inducing layer 162 as a seed. The first strain inducing layer 162 and the second strain inducing layer 164 may be formed in an in-situ method (e.g., grown sequentially in the same process chamber without removal or a vacuum break of the process chamber).

According to an exemplary embodiment, the second strain inducing layer 164 may be formed to have a shape including faceted side walls. For example, the second strain inducing layer 164 may be formed to have the second side wall FS-1P. The second side wall FS-1P may extend from the first strain inducing layer 162, which is formed on the upper surface of the base portion 112a, and be inclined at a second intersecting angle θ2 with respect to an upper surface of the substrate 110, and the third side wall FS-2P may contact an uppermost portion of the second side wall FS-1P and be inclined at a third intersecting angle θ3 with respect to the upper surface of the substrate 110. The second intersecting angle θ2 and the third intersecting angle θ3 may be within a range of about 51° to about 59°. For example, the second intersecting angle θ2 and the third intersecting angle θ3 may be within a range of about 54° to about 57°.

When the second strain inducing layer 164 is formed by using a selective epitaxial process, a growth speed along a direction perpendicular to a known crystallographic plane may be higher than a growth speed along a direction perpendicular to another crystallographic plane, according to the structure of a silicon crystal. That is, according to the growth direction, the growth speed of the second strain inducing layer 164 may vary, and a faceted side wall may be generated along a direction parallel with a crystallographic plane and along a direction perpendicular to which the growth speed is low. For example, when a main surface of the substrate 110 is arranged in parallel with a crystallographic plane {100}, a faceted side wall may be formed along a direction parallel with the crystallographic plane {111}, inclined at about 55.7° with respect to the upper surface of the substrate 110.

In an example embodiment where the second strain inducing layer 164 is formed by using the first strain inducing layer 162, formed on the upper surface of the base portion 112a and the side surface of the protrusion portion 112*b*, exposed by the recess 112R2, as a seed layer, the second side walls FS-1P, extending from a portion of the first strain inducing layer 162, which is on the upper surface of the base portion 112*a* to be inclined at the second intersecting angle θ2, may be formed. Also, the third side walls FS-2P, extending from an uppermost edge of the protrusion portion 112*b* to be inclined at the third intersecting angle θ3, may be formed. Also, edges of the second strain inducing layer 164 may be formed to a horizontal point where the second side walls FS-1P and the third side walls FS-2P meet According to an exemplary embodiment, as illustrated in FIG. 2F, the second strain inducing layer 164 may have a pentagonal shaped cross-sectional plane taken along direction Y, and the pentagonal shape may be defined by a bottom surface contacting the first strain inducing layer 162, two second side walls FS-1P as edges, and two third side walls FS-2P as edges. However, the cross-sectional shape of the second strain inducing layer 164 is not limited to the pentagonal shape. For example, the second strain inducing layer 164 may be formed to further include one or more additional side walls inclined at different angles from the second and third side walls FS-1P and FS-2P.

As illustrated in FIG. 2F, the uppermost portion of the second strain inducing layer 164 is located where the two inclined side walls FS-2P contact each other. The uppermost surface of the second strain inducing layer 164 may be The, the upper portion of the second strain inducing layer 164, which is higher than the uppermost surface of the first strain inducing layer 162, may contact the side wall of the second spacer 152P.

According to an exemplary embodiment, the edges of the second strain inducing layer 164 are defined by the two second side walls FS-1P and the two third side walls FS-2P. The maximum width WM2 of the second strain inducing layer, the height H2 at a point in which the second strain inducing layer 164 has the maximum width WM2, and the height H4 of the second strain inducing layer 164 may be determined by the two second side walls FS-1P and the two third side walls FS-2P.

The source/drain capping layer 166 may be formed on the second source/drain region 160P. The source/drain capping layer 166 may cover the exposed surface of the second strain inducing layer 164. The source/drain capping layer 166 may be formed by using, for example, silicon doped with a dopant for a first conductive type, or un-doped silicon.

Figure 2G:
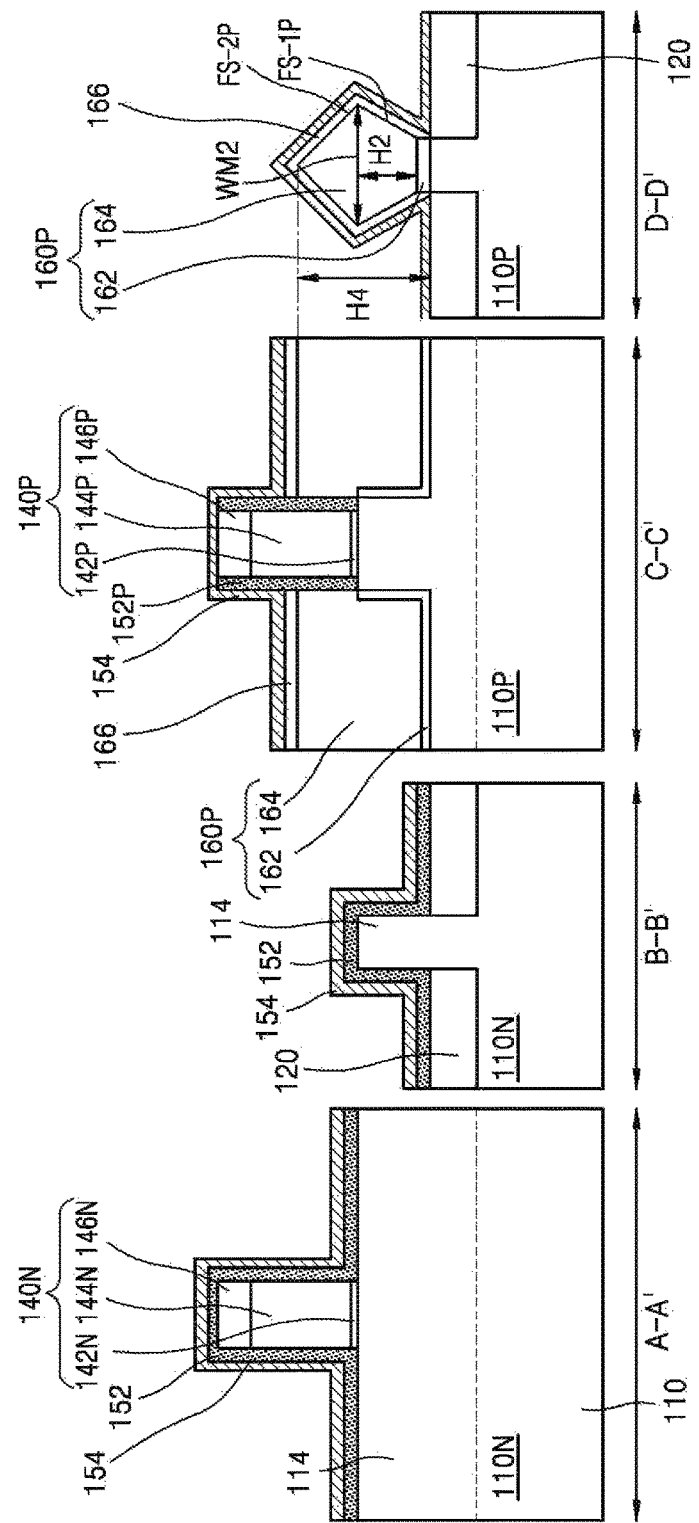

Referring to FIG. 2G, the preliminary second spacer layer 154 covering the preliminary first spacer layer 152, the first and second gate structures 140N and 140P, respectively, and the source/drain capping layer 166 may be formed on the NMOS region 110N and the PMOS region 110P of the substrate 110. The preliminary second spacer layer 154 may be formed by using, for example, a silicon nitride layer or a silicon oxynitride layer.

The preliminary second spacer layer 154 may cover an upper surface of the second gate structure 140, that is, an upper surface of the second gate mask 146P. Also, second spacers 152P may be interposed between side walls of the second gate structure 140P and the preliminary second spacer layer 154.

Figure 2H:
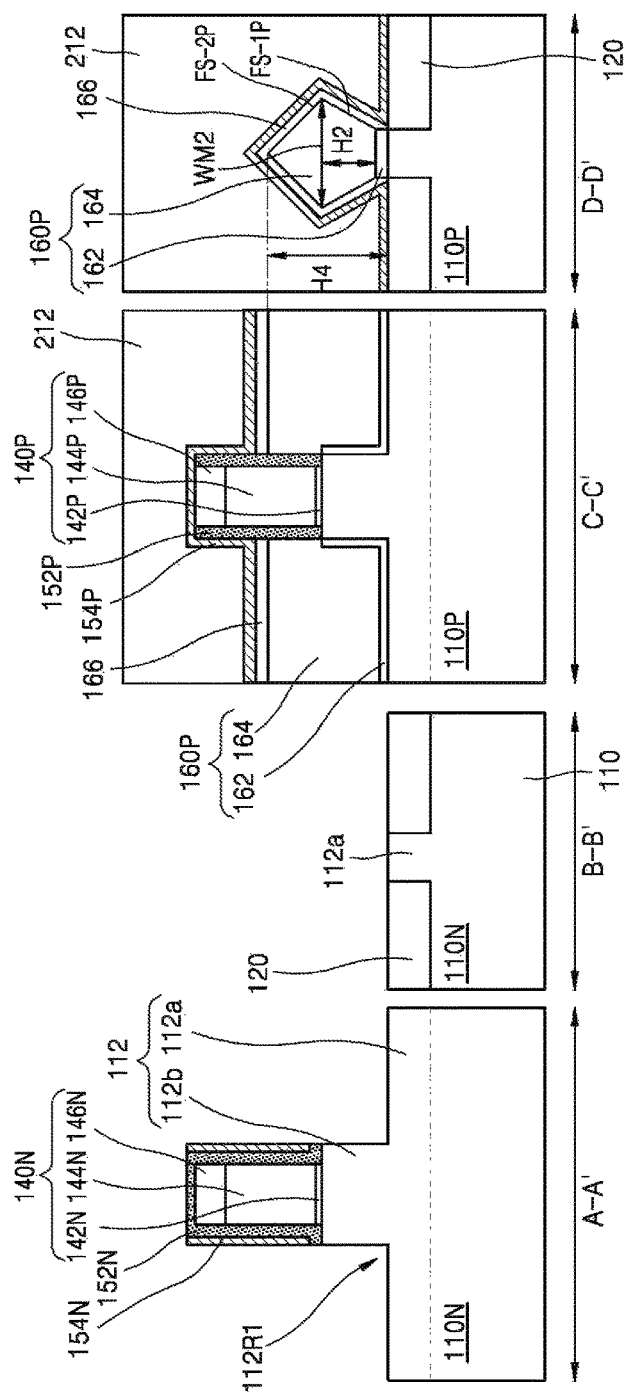

Referring to FIG. 2H, a second blocking layer 212 covering the PMOS region 110P of the substrate 110 may be formed. An anisotropic etching process may be performed on the preliminary second spacer layer 154 (refer to FIG. 2G) exposed on the NMOS region 110N of the substrate 110, in order to form the fin structure 112 having the protrusion portion 112*b* and the pair of recesses 112R1 located at both sides of the protrusion portion 112*b*, in the NMOS region 110N.

As illustrated in FIG. 2H, the etching process may be performed until an upper surface of a portion of the protrusion pattern 114 that is located at both sides of the first gate structure 140N is located at a level substantially the same as or similar to a level of an upper surface of the isolation layer 120.

By the anisotropic etching process, a portion of the preliminary second spacer layer 154, on the NMOS region 110N, may be removed, and only a portion of the preliminary second spacer layer 154, on the side walls of the first gate structure 140N, may remain so as to become third spacers 154N. The first spacer 152N may be interposed between the third spacer 154N and the side walls of the first gate structure 140N. Also, a portion of the preliminary second spacer layer 154, located on the PMOS region 110P, may be referred to as the fourth spacer 154P.

Then, the second blocking layer 212 may be removed.

Figure 2I:
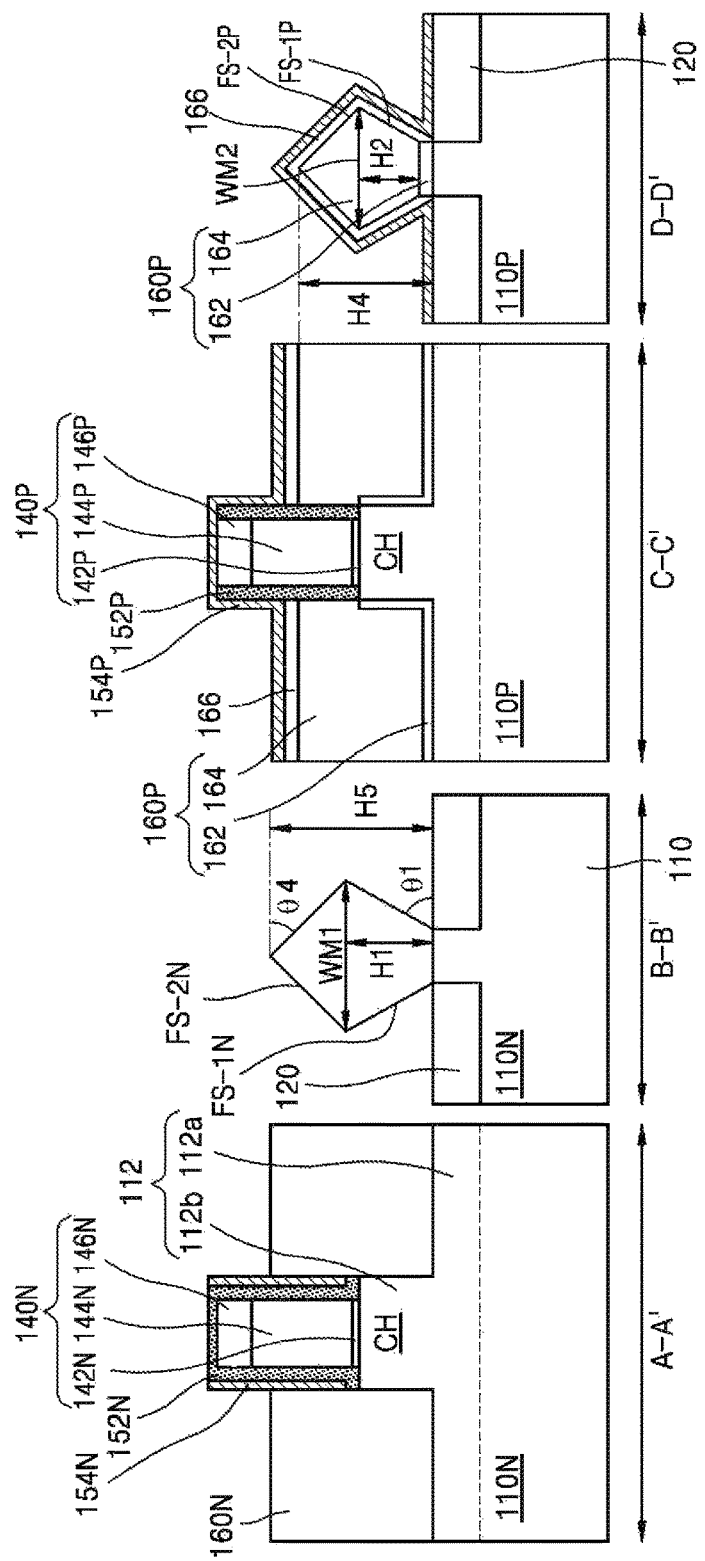

Referring to FIG. 2I, the first source/drain region 160N may be formed on the exposed surface of the fin structure 112 on the NMOS region 110N, that is, on the upper surface of the base portion 112*a* and the side surface of the protrusion portion 112*b*, exposed by the pair of recesses 112R1.

According to an exemplary embodiment, the first source/drain region 160N may be formed by using a semiconductor material including silicon. For example, the first source/drain region 160N may include or essentially consist of silicon including carbon (SiC) doped with an charge carrier impurity such as phosphorous. The first source/drain region 160N may include boron, or a silicon-germanium material. The first source/drain region 160N may be formed by using, for example, an SEG method using the fin structure 112 as a seed.

According to an exemplary embodiment, the first source/drain region 160N may be formed to have a shape including faceted side walls. These faceted side walls (as well as other faceted side walls described herein) may have a planar surface. For example, the first source/drain region 160N may be formed to include the first side wall FS-1N extending from the upper surface of the base portion 112*a* (refer to FIG. 2H) and inclined at the first intersecting angle θ1 with respect to the upper surface of the substrate 110, and a fourth side wall FS-2N contacting the uppermost portion of the first side wall FS-1N and inclined at a fourth intersecting angle θ4 with respect to the upper surface of the substrate 110. The first intersecting angle θ1 and the fourth intersecting angle θ4 may be within a range of about 51° to about 59°. For example, the first intersecting angle θ1 and the fourth intersecting angle θ4 may be within a range of about 54° to about 57°.

According to an exemplary embodiment, in the process of forming the first source/drain region 160N, the first source/drain region 160N may be formed to have a height H5 that is greater than the height H4 of the second source/drain region 160P, by overgrowing the first source/drain region 160N by using the upper surface of the base portion 112*a* and the side surface of the protrusion portion 112*b*, exposed by the recess 112R1, as a seed. As illustrated in FIG. 2I, the first source/drain region 160N may have a pentagonal cross-sectional plane taken along a perpendicular direction (that is, a cross-sectional plane taken along direction Y). However, the shape of the cross-sectional plane of the first source/drain region 160N is not limited to the pentagonal shape. For example, the first source/drain region 160N may be formed to further include one or more additional side walls inclined at different angles than the first and fourth side walls FS-1N and FS-2N, respectively, and where each may incline within different ranges than the aforementioned ranges.

The first source/drain region 160N may have the maximum width WM1 at a point in which the first side wall FS-1N and the fourth side wall FS-2N contact each other, and the maximum width WM1 of the first source/drain region 160N may be greater than the maximum width WM2 of the second source/drain region. Also, the height H1 at a point in which the first source/drain region 160N has the maximum width WM1 may be greater than the height H2 at a point in which the second source/drain region 160P has the maximum width WM2.

As illustrated in FIG. 2I, an uppermost surface of the first source/drain region 160N may be higher than an uppermost portion of the side wall of the protrusion portion 112b, and the upper portion of the first source/drain region 160N, which is higher than the uppermost portion of the side wall of the protrusion portion 112b, may contact a side wall of the third spacer 154N.

A portion of the protrusion portion 112b, which is defined by the first source/drain region 160N in the NMOS region 110N, and a portion of the protrusion portion 112b, which is defined by the second source/drain region 160P in the PMOS region 110P (for example, the first strain inducing layer 162), may be the channel region CH. The first source/drain region 160N and the second source/drain region 160P (for example, the second strain inducing layer 164) may be formed to have a conductivity type different from that of the channel region CH. For example, when the channel region CH is formed by using a semiconductor material having a p-type in the NMOS region 110N, the first source/drain region 160N may be formed by using a semiconductor material having an n-type. In example embodiments, where the channel region CH is formed by using a semiconductor material having an n-type in the PMOS region 110P, the second source/drain region 160P may be formed by using a semiconductor material having a p-type.

Figure 2J:
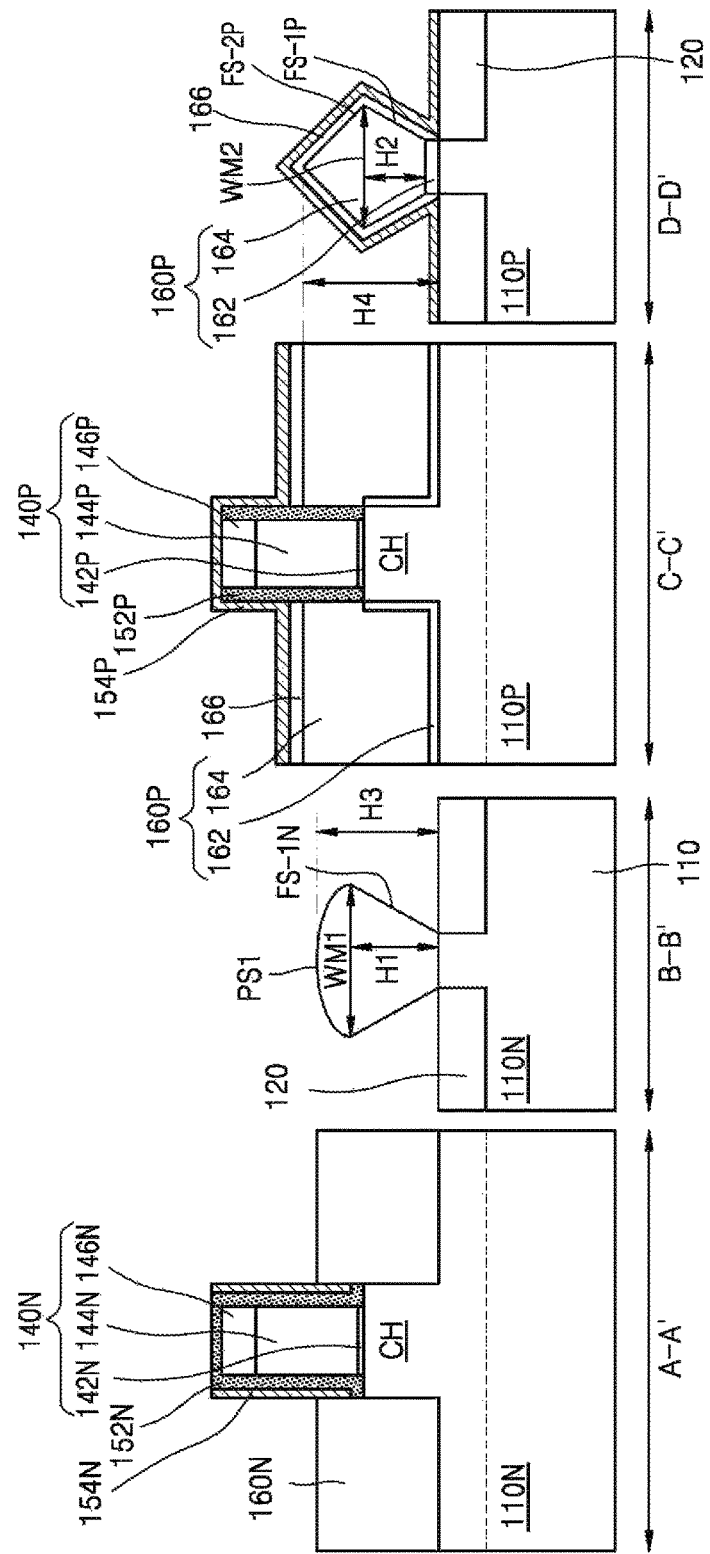

Referring to FIG. 2J, an upper portion of the first source/drain region 160N may be removed by performing an etch-back process on the first source/drain region 160N. By the etch-back process, the planarized first upper surface PS1 may be formed on the first source/drain region 160N. Also, the first upper surface PS1 of the first source/drain region 160N may have a shape which is rounded from a point in which the first upper surface PS1 contacts the first side wall FS-1N.

The height H3 between an uppermost portion of the first upper surface PS1 and a bottom portion of the first source/drain region 160N, along the vertical direction, may be less than the height (H5 of FIG. 2I) between an uppermost portion of the fourth side wall FS-2N and the bottom portion of the first source/drain region 160N, before the etch-back process. The height H3 of the first source/drain region 160N, after the etch-back process, may be less than or substantially the same as the height H4 of the second source/drain region 160P. For example, an etching height of the first source/drain region 160N H3 may be within a range of less than 2 nm or less than 30 nm of the height H4 of the second source/drain region 160P. However, the etching height of the first source/drain region 160N is not limited thereto.

According to an exemplary embodiment, the etch-back process may be a process which uses a dry etching method. In other exemplary embodiments, the etch-back process may be performed in-situ with in an epitaxial growth process of the first source/drain region 160N (e.g., after epitaxial growth, the first source/drain region 160N is subject to the etch-back process without removing the device from the process chamber, e.g., without a vacuum seal break). For example, the etch-back process may be performed in the in-situ method by using a hydrochloride gas, after forming the first source/drain region 160N.

An upper portion of the second source/drain region 160P is covered by the fourth spacer 154P, and thus may not be damaged by the etch-back process.

Figure 2K:
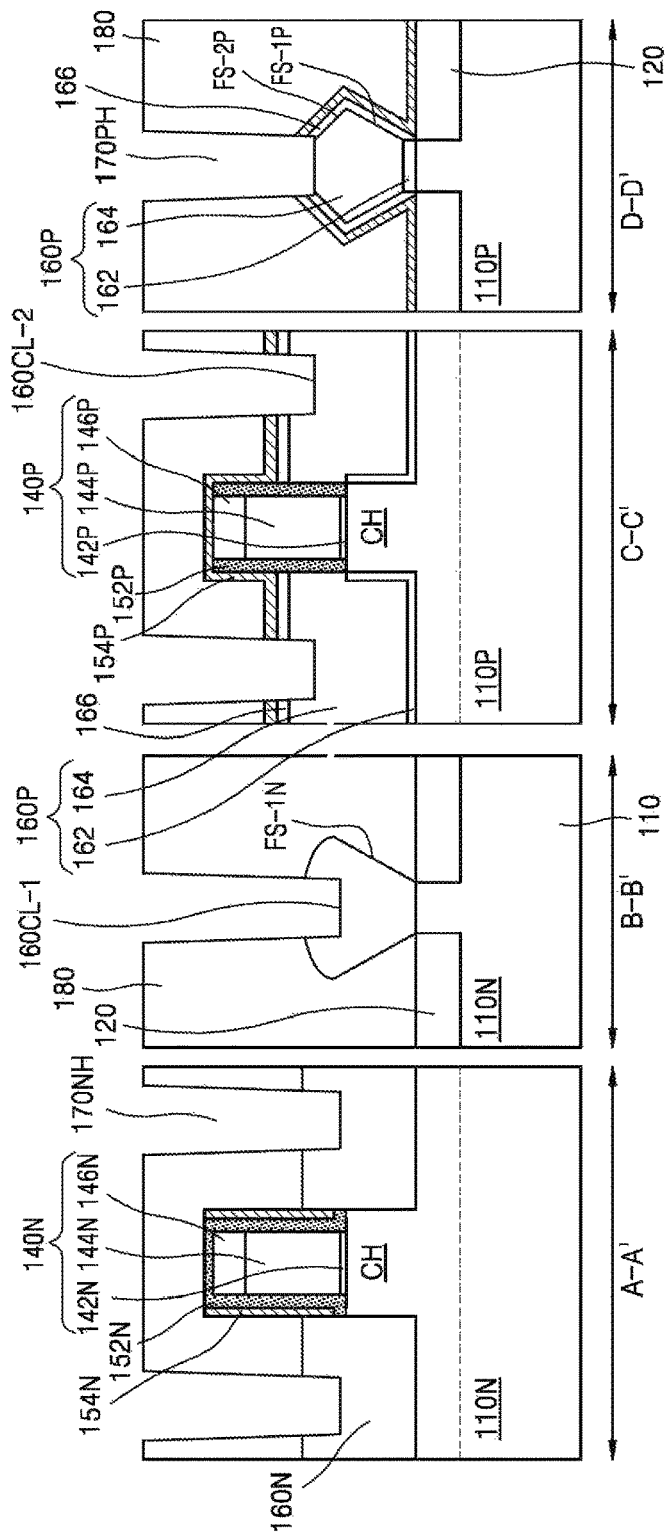

Referring to FIG. 2K, an insulating interlayer 180 may be formed on the NMOS region 110N and the PMOS region 110P of the substrate 110. According to an exemplary embodiment, the insulating interlayer 180 may be formed, for example, by using a silicon oxide layer, a silicon nitride layer, and a silicon oxynitride layer.

Then, a first contact hole 170NH and a second contact hole 170PH penetrating through the insulating interlayer 180 to expose upper surfaces of the first and second source/drain regions 160N and 160P may be formed.

The upper surface of the first source/drain region 160N, which is exposed by the first contact hole 170NH, may be referred to as the first contact landing surface 160CL-1 and the upper surface of the second source/drain region 160P, which is exposed by the second contact hole 170PH, may be referred to as the second contact landing surface 160CL-2. Since an uppermost surface of the first source/drain region 160N is lower than or substantially the same as an uppermost surface of the second source/drain region 160P (that is, the height H3 of the first source/drain region 160N is lower than or substantially the same as the height H4 of the second source/drain region 160P), the first contact landing surface 160CL-1 may be lower than the second contact landing surface 160CL-2. In some examples, one or more of the materials etched to form contact hole 170PH have a lower etch rate than that of the materials etched to form contact hole 170NH. In some examples, the second spacer layer 154 material may have a relatively higher resistance to the etchant used to etch contact hole 170PH than that of the material forming first source/drain region 160N.

Figure 2L:
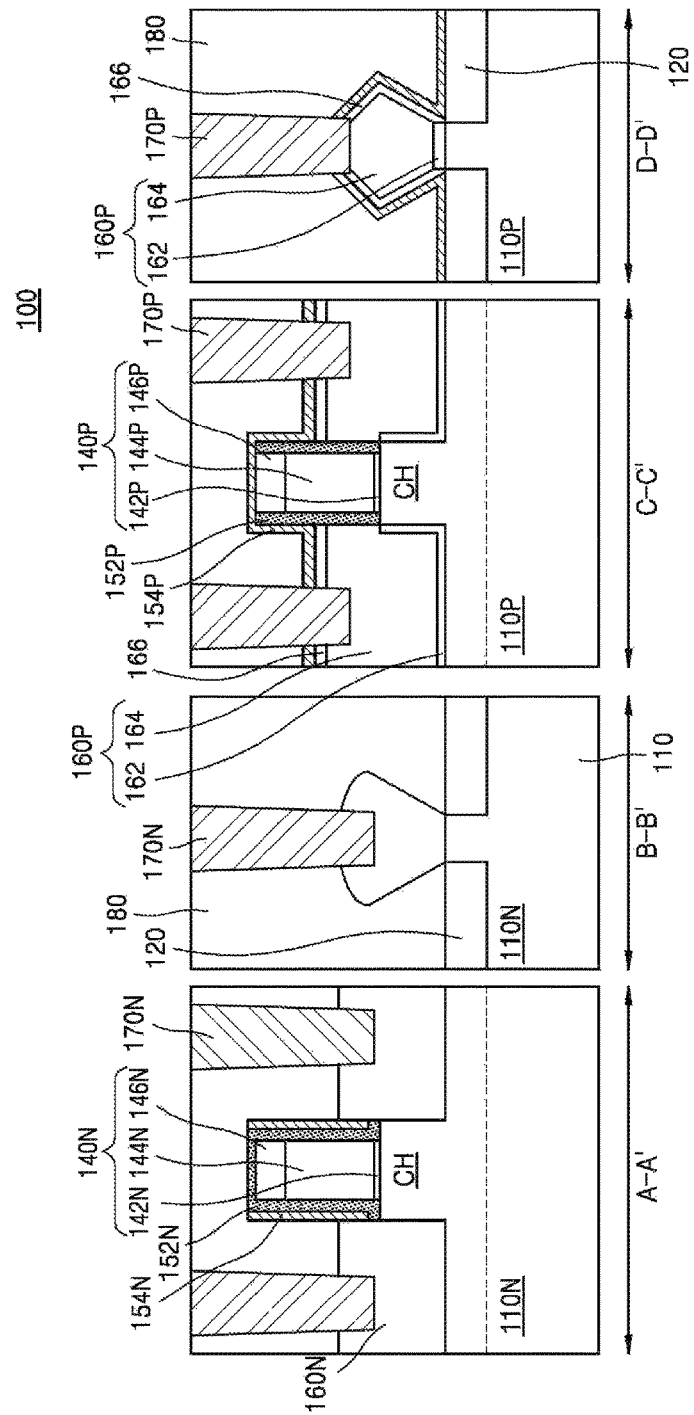

Referring to FIG. 2L, the first and second contact plugs 170N and 170P may be formed in the first and second contact holes 170NH and 170PH (refer to FIG. 2K) by forming a conductive layer (not shown) filling the first and second contact holes 170NH and 170PH on the insulating interlayer 180, and then planarizing an upper portion of the conductive layer until an upper surface of the insulating interlayer 180 is exposed.

Although it is not illustrated, the first and second contact plugs 170N and 170P may be formed by using a combination of one or more materials selected from a metal, metal nitride, and metal silicide. For example, the first and second contact plugs 170N and 170P may be formed in a multilayer structure including a metal silicide layer and a metal layer, which are sequentially stacked on the first and second source/drain regions 160N and 160P. Conformal layers (insulating or conductive) (not shown) may be formed on sidewalls between insulating interlayer 180 and the metal layer.

The semiconductor device 100 is completely manufactured by performing some of the above-described, exemplary processes.

In the semiconductor device 100, the resistance between the first source/drain region 160N and the first contact plug 170N and the resistance between the second source/drain region 160P and the second contact plug 170P may be simultaneously reduced.

In the NMOS transistor 100N, the greater a volume of the first source/drain region 160N is, the less may be the resistance in the first source/drain region 160N. In the PMOS transistor 100P, the resistance of the second source/drain region 160P may be reduced by the second strain inducing layer 164 using silicon germanium. Where the volume of the first source/drain region 160N is increased by overgrowing the first source/drain region 160N, a location difference of the first and second contact landing surfaces 160CL-1 and 160CL-2 of the first and second source/drain regions 160N and 160P may be allowed to occur in the etching process of the first and second contact holes 170NH and 170PH. In particular, since an etching speed of the second source/drain region 160P, including germanium, is high, the height difference of the first and second contact landing surfaces 160CL-1 and 160CL-2 may be intensified, that is, an upper portion of the second source/drain region 160P may be excessively etched. In this case, the strain generated by the second strain inducing layer 164 using silicon germanium may be removed and thus, the resistance in the second source/drain region 160P may be increased.

However, according an exemplary method of manufacturing the semiconductor device 100, an etch-back process may be performed on the upper portion of the first source/drain region 160N, and thus, the upper surface of the first source/drain region 160N may be lowered relative to an upper surface of the second source/drain region 160P. Accordingly, the first contact landing surface 160CL-1 may be located lower than the second contact landing surface 160CL-2 and lower in relation to the first upper surface PS1 of the first source/drain region 160N. The contact hole 170NH may penetrate the first source/drain region 160N material to a larger extend than that of contact hole 170PH into the second source/drain region 160P, thus providing additional contact are for first contact plug 170N as compared to that of second contact plug 170P. Thus, the first source/drain region 160N may obtain a sufficient area for contacting the first contact plug 170N so that the first source/drain region 160N may have a low resistance. Also, the higher height of the second source/drain region 160P may prevent the above-described excessive etching, thereby preventing the removing of the strain due to a decrease in a volume of the second source/drain region 160P around the second contact landing surface 160CL-2. Accordingly, the second source/drain region 160P may also have a low resistance.

FIG. 3A is a perspective of a semiconductor device 100a, according to an exemplary embodiment.

Figure 3B:
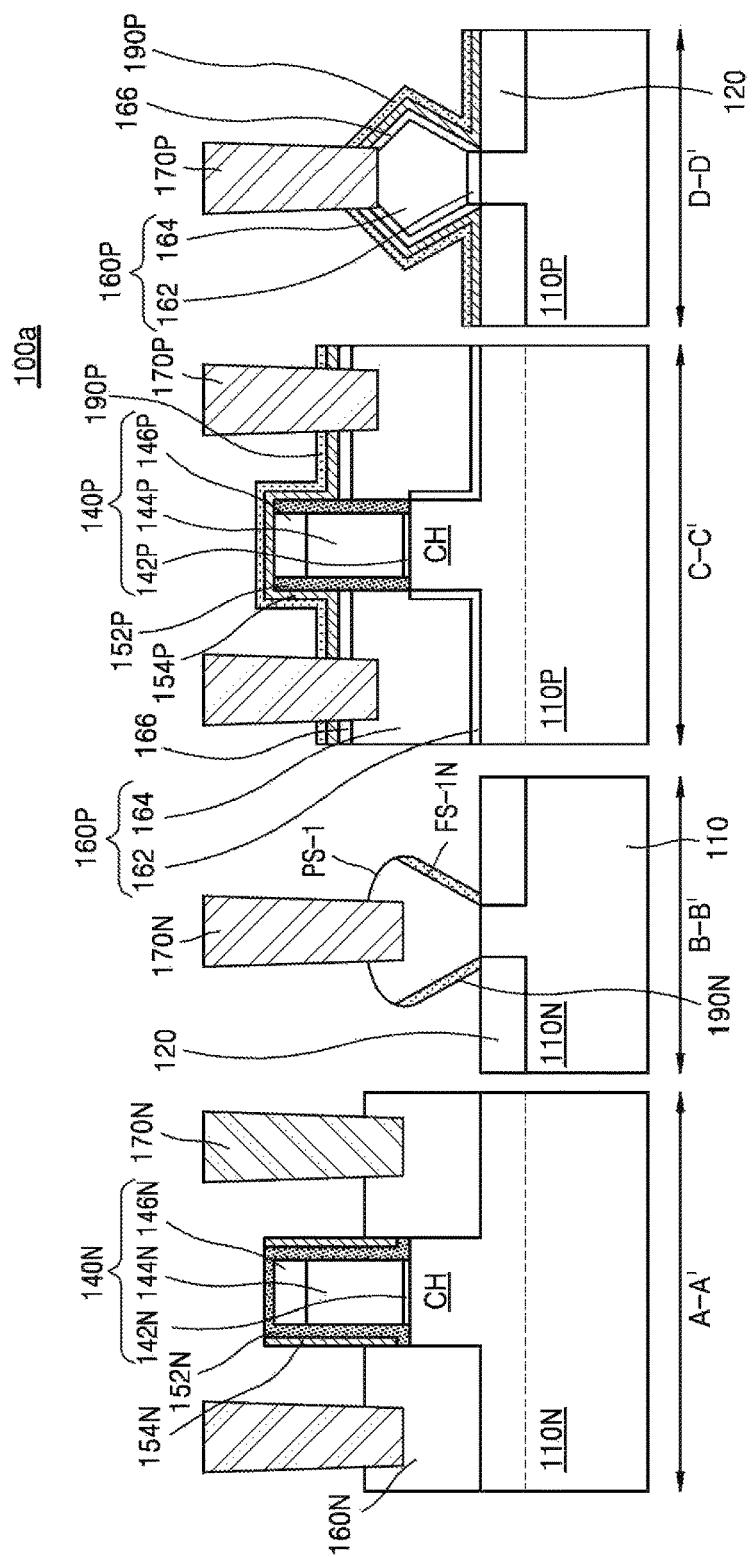
FIG. 3B is a cross-sectional view of a semiconductor device according to an exemplary embodiment.

FIG. 3B is a cross-sectional view of the semiconductor device 100a. FIG. 3B illustrates cross-sectional planes taken along lines A-A', B-B', C-C', and D-D' of FIG. 3A.

The semiconductor device 100a is similar to the semiconductor device 100 described with reference to FIGS. 1A through 1C, except for capping layers 190N and 190P, and thus, descriptions will be made by focusing on the difference. Hereinafter, like reference numerals refer to like elements.

Referring to FIGS. 3A and 3B, the first capping layer 190N may be formed on a side wall of the first source/drain region 160N and the second capping layer 190P may be formed on a side wall of the second source/drain region 160P. The first capping layer 190N may be formed to surround the first side wall FS-1N of the first source/drain region 160N and the first capping layer 190N may not be formed on the first upper surface PS1 of the first source/drain region 160N. The second capping layer 190P may be formed throughout an upper surface of the fourth spacer 154P and may contact a portion of the second contact plug 170P.

According to an exemplary embodiment, the first and second capping layers 190N and 190P may include an insulating material, such as a silicon oxide layer, a silicon nitride layer, and a silicon oxynitride layer.

FIGS. 4A through 4D are cross-sectional views for describing a method of manufacturing a semiconductor device, according to an exemplary embodiment. The method described with reference to FIGS. 4A through 4D may correspond to a method of manufacturing the semiconductor device 100a described with reference to FIGS. 3A and 3B. FIGS. 4A through 4D illustrate cross-sectional planes taken along lines A-A', B-B', C-C', and D-D' of FIG. 3A, for describing processes of manufacturing the semiconductor device 100a.

First, an intermediate structure illustrated in FIG. 2I is formed by performing the exemplary processes described with reference to FIGS. 2A through 2I.

Figure 4A:
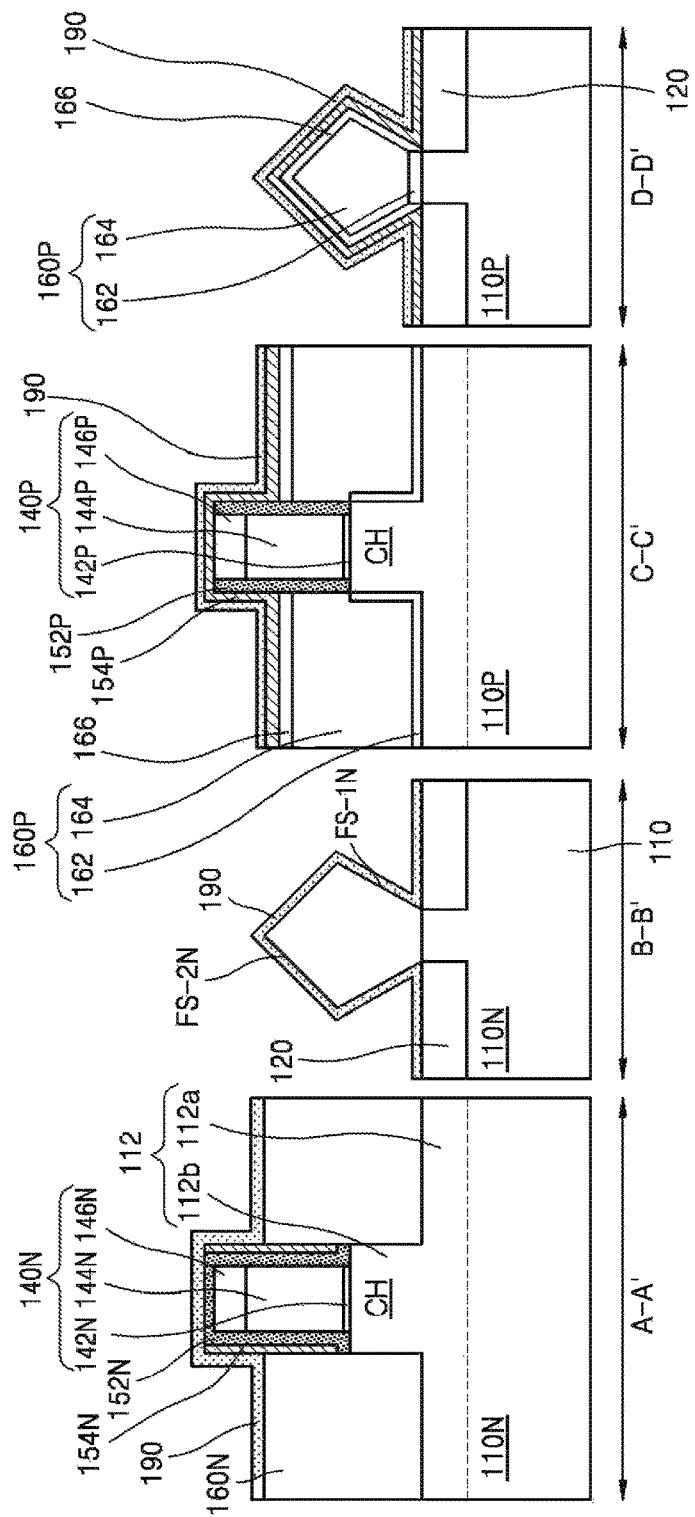
FIGS. 4A through 4D are cross-sectional views for describing a method of manufacturing a semiconductor device, according to an exemplary embodiment.

Referring to FIG. 4A, a preliminary capping layer 190 covering the first and second gate structures 140N and 140P and the first and second source/drain regions 160N and 160P may be formed. The preliminary capping layer 190 may be formed on the first and fourth side walls FS-1N and FS-2N of the first source/drain region 160N to a controlled thickness. The preliminary capping layer 190 may be formed by using an insulating material, such as a silicon oxide layer, a silicon nitride layer, and a silicon oxynitride layer.

Figure 4B:
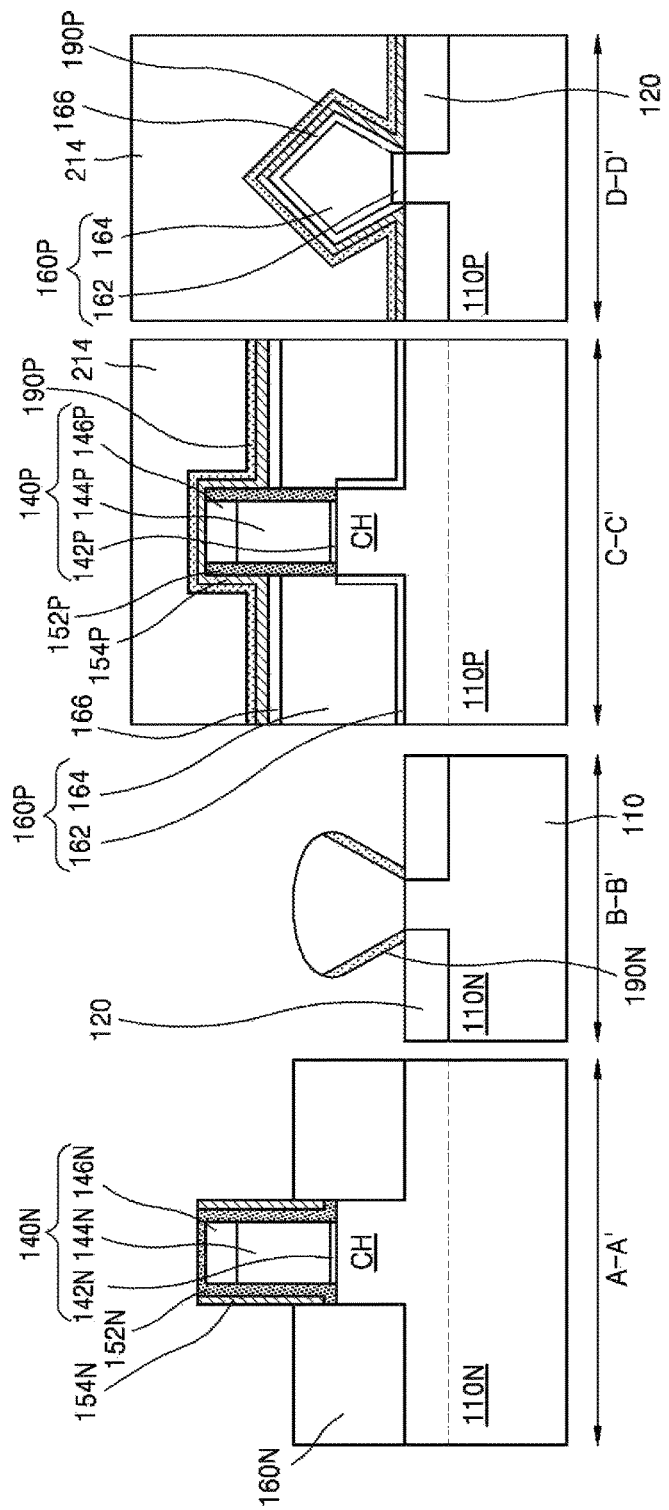

Referring to FIG. 4B, a third blocking layer 214 covering the second gate structure 140P and the second source/drain region 160P may be formed on the PMOS region 110P of the substrate 110.

Next, an upper portion of the first source/drain region 160N may be removed by performing an etch-back process on the NMOS region 110N of the substrate 110. In example embodiments a portion of the preliminary capping layer (190 of FIG. 4A), which is located on the first source/drain region 160N, may also be removed.

After the etch-back process, a portion of the preliminary capping layer 190, which remains on a side wall of the first source/drain region 160N, may become the first capping layer 190N, and a portion of the preliminary capping layer 190, which is located on the second source/drain region 160P, may become the second capping layer 190P. The fourth spacer 154P may be interposed between the second capping layer 190P and the second source/drain region 160P.

Figure 4C:
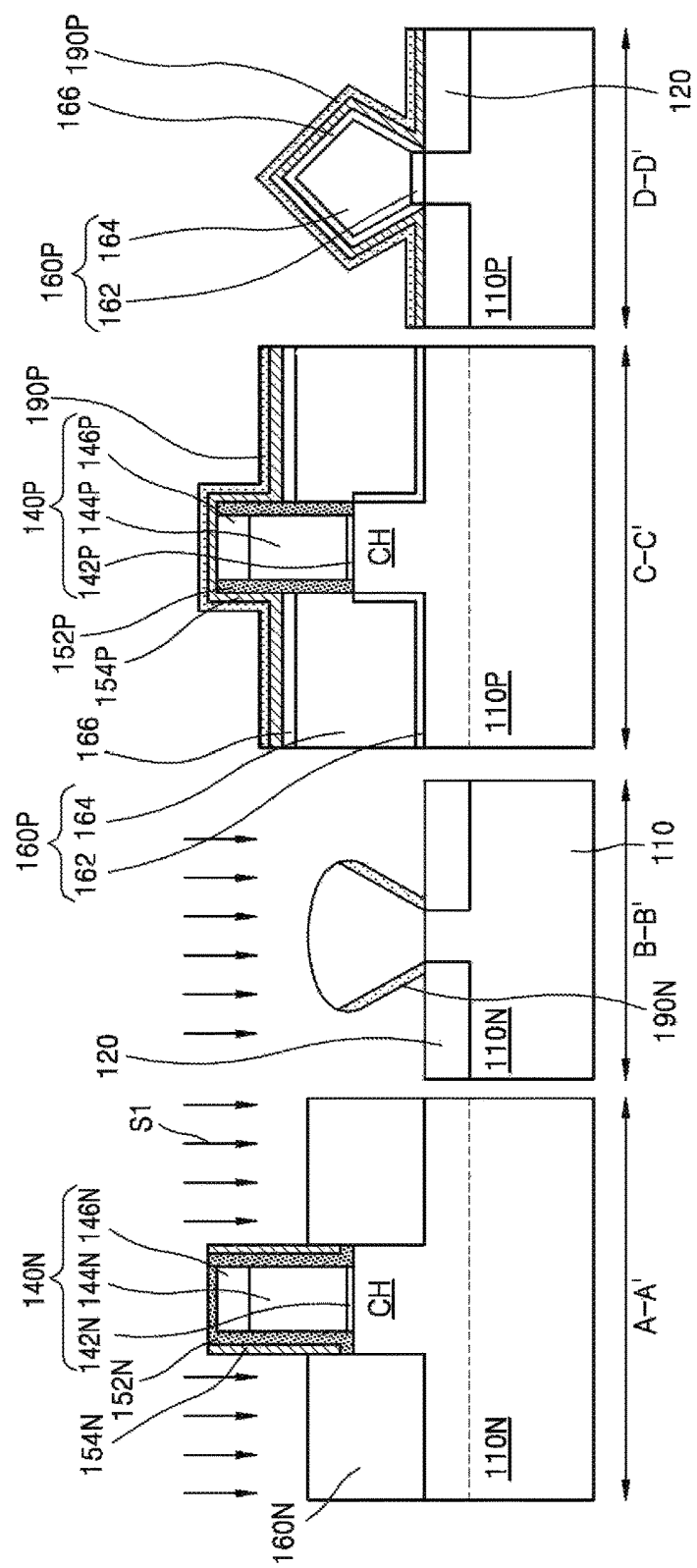

Referring to FIG. 4C, an ion implantation process 51 may be performed on the first source/drain region 160N. The ion implantation process 51 may be a process for implanting n-type dopant ions.

Unlike the above process, the ion implantation process may be performed before the etch-back process is performed (e.g., on the source/drain region 160N structure shown in FIG. 4A). In this case, the ion implantation process may be performed in a state in which the upper portion of the first source/drain region 160N is covered by the preliminary capping layer 190 (refer to FIG. 4A), and a profile of dopant ions implanted in the first source/drain region 160N may be controlled.

Figure 4D:
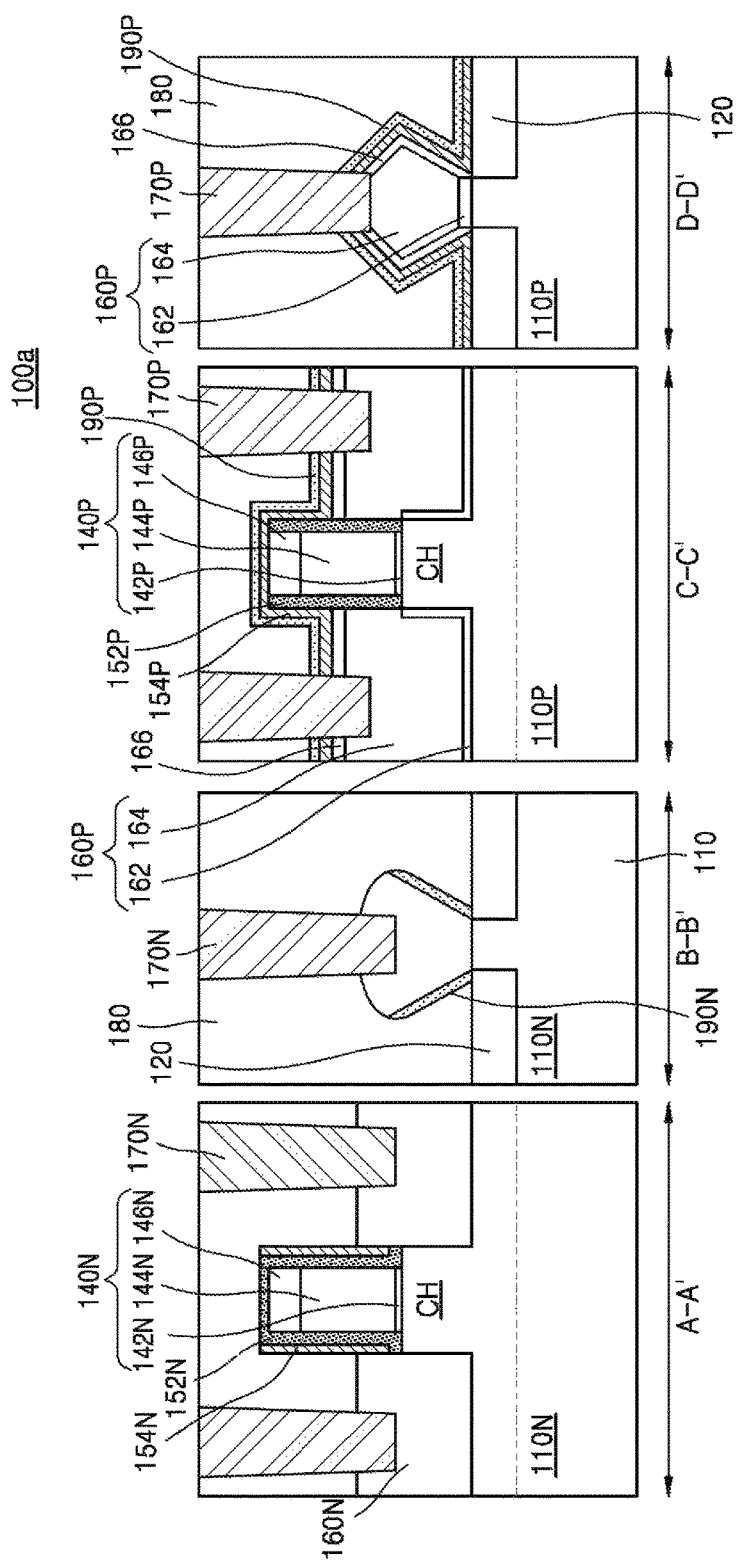

Referring to FIG. 4D, the insulating interlayer 180 may be formed on side walls of the first gate structure 140N, the first source/drain region 160N, and the first capping layer 190N of the NMOS region 110N, and on the second capping layer 190P of the PMOS region 110P.

Next, the semiconductor device 100a may be completed by performing the processes described with reference to FIGS. 2K and 2L.

Figure 5A:
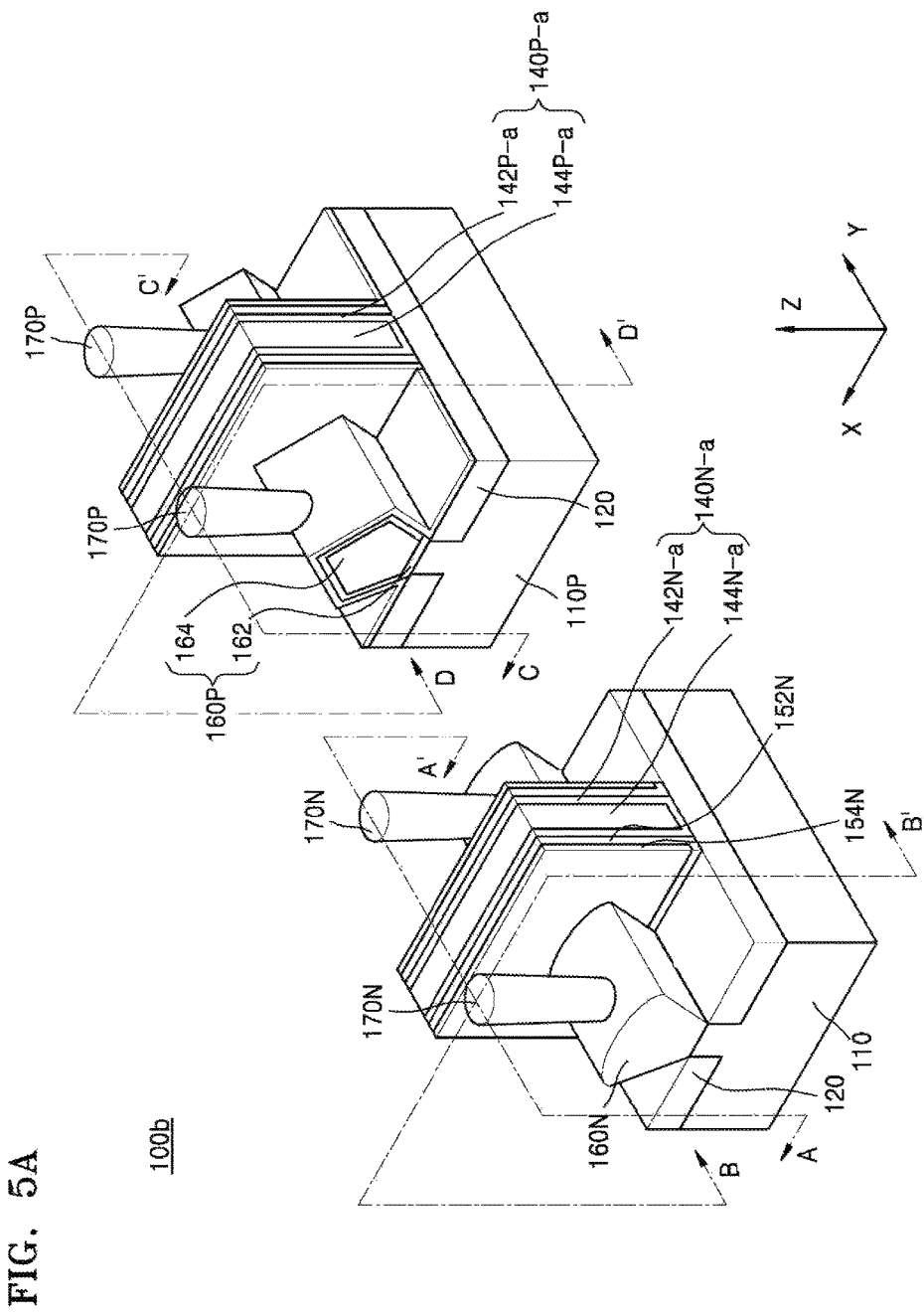
FIG. 5A is a perspective view of a semiconductor device according to an exemplary embodiment.

FIG. 5A is a perspective view of a semiconductor device 100b according to an exemplary embodiment.

Figure 5B:
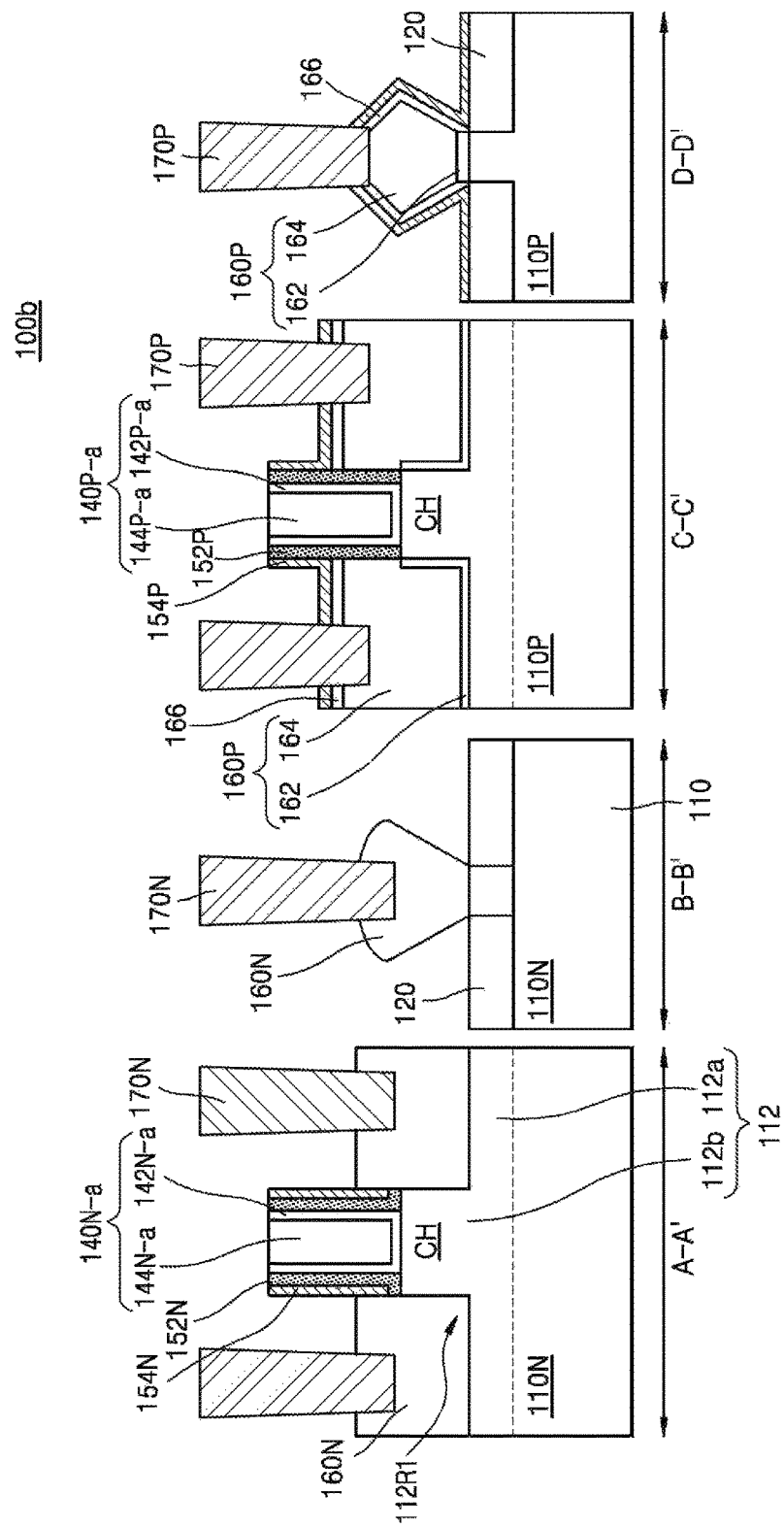
FIG. 5B is a cross-sectional view of a semiconductor device according to an exemplary embodiment.

FIG. 5B is a cross-sectional view of the semiconductor device 100b. FIG. 5B illustrates cross-sectional planes taken along lines A-A', B-B', C-C', and D-D' of FIG. 5A.

The semiconductor device 100b is similar to the semiconductor device 100 described with reference to FIGS. 1A through 1C, except for gate structures 140N-a and 140P-a, and thus, descriptions will be made by focusing on the difference. Hereinafter, like reference numerals refer to like elements.

Referring to FIGS. 5A and 5B, the first gate structure 140N-a may include a first gate electrode 144N-a and a first gate insulating layer 142N-a disposed on a bottom surface and a side wall of the first gate electrode 144N-a. The first spacer 152N may be formed on a side wall of the first gate structure 140N-a, and the third spacer 154N may be disposed on the side wall of the first gate structure 140N-a so that the first spacer 152N is interposed between the third spacer 154N and the first gate structure 140N-a.

The second gate structure 140P-a may include a second gate electrode 144P-a and a second gate insulating layer 142P-a disposed on a bottom surface and a side wall of the second gate electrode 144P-a. The second spacer 152P may be formed on a side wall of the second gate structure 140P-a, and the fourth spacer 154P may be formed on a portion of the side wall of the second gate structure 140P-a so that the second spacer 152P is interposed between the fourth spacer 154P and the second gate structure 140P-a.

Figure 6A:
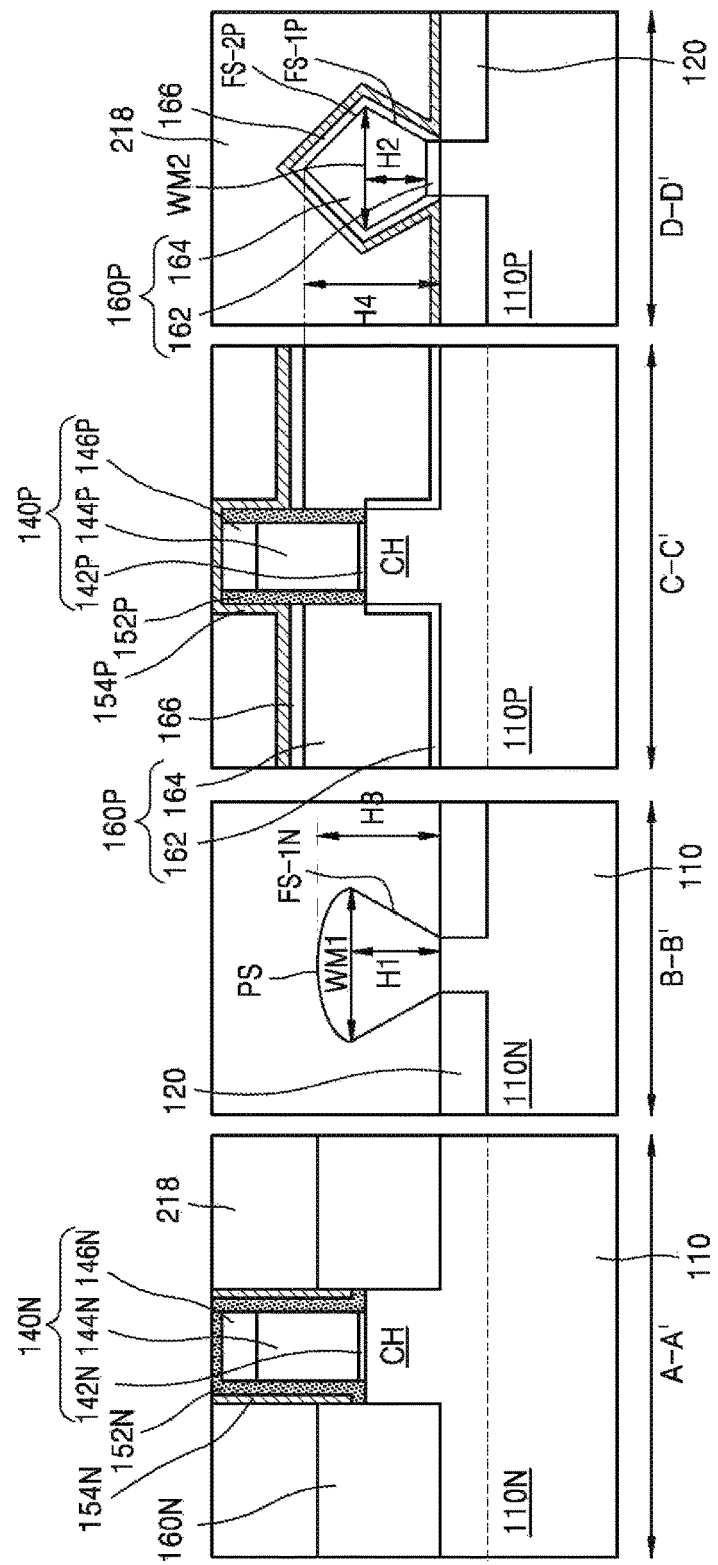
FIGS. 6A through 6C are cross-sectional views for describing a method of manufacturing a semiconductor device, according to an exemplary embodiment.
Figure 6B:
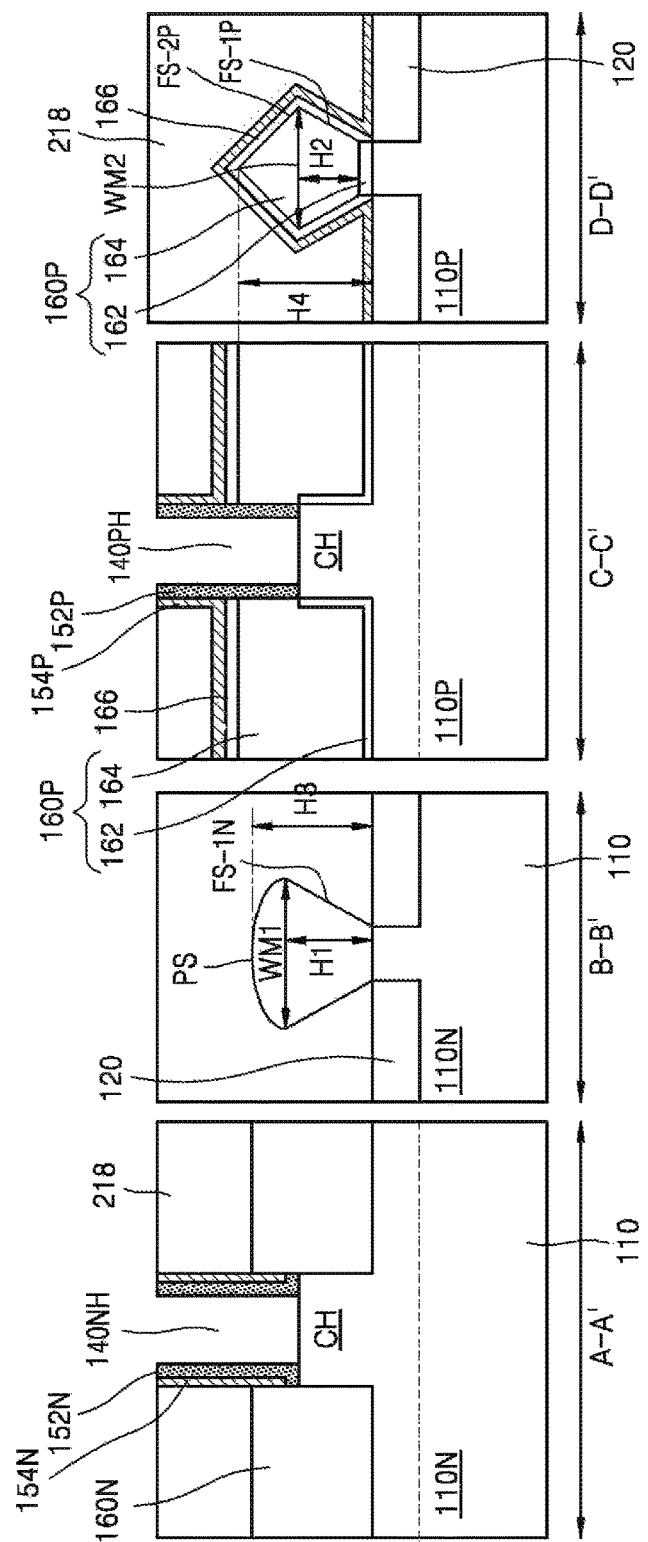
Figure 6C:
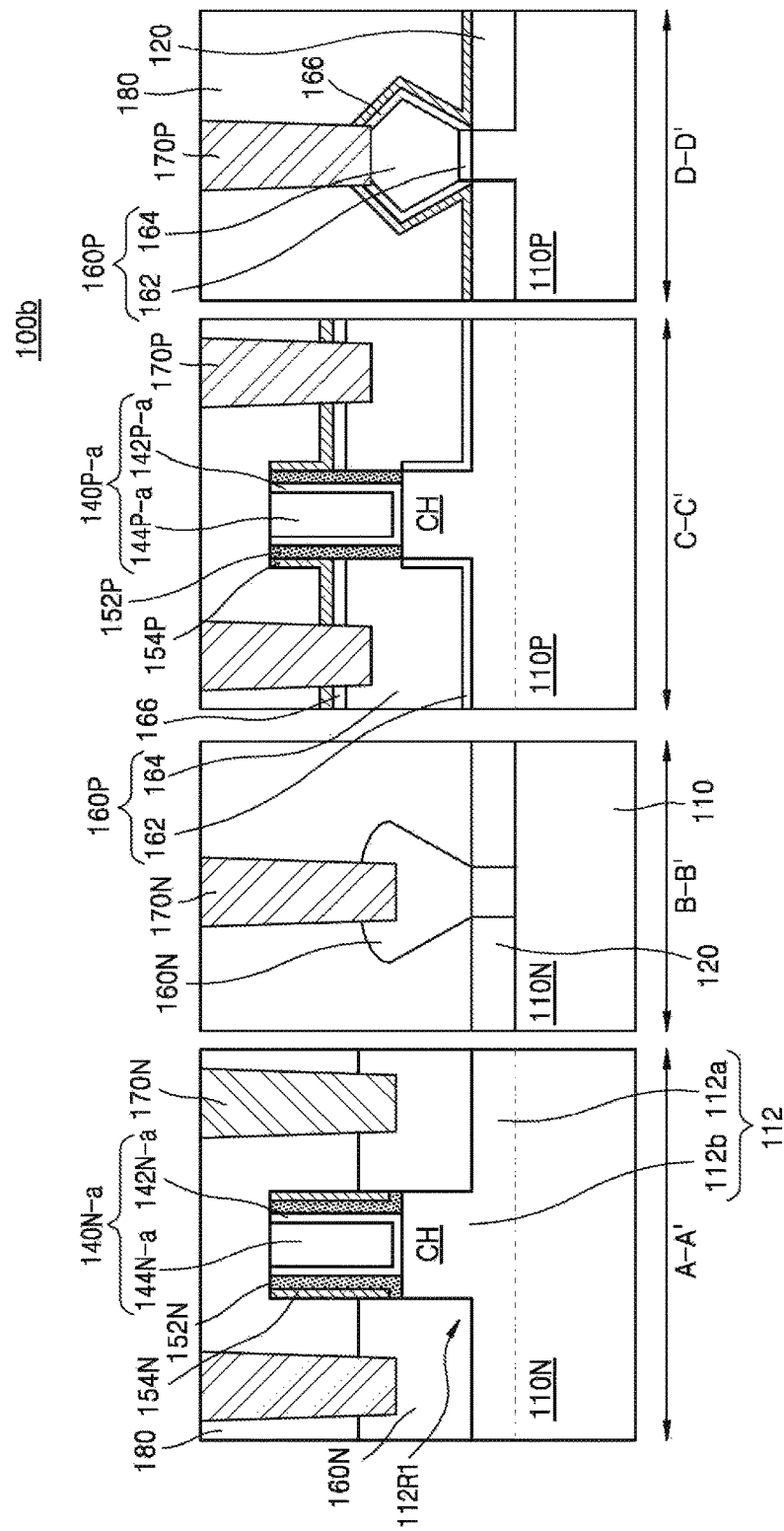

FIGS. 6A through 6C are cross-sectional views for describing a method of manufacturing a semiconductor device, according to an exemplary embodiment. The method described with reference to FIGS. 6A through 6C may correspond to a method of manufacturing the semiconductor device 100b described with reference to FIGS. 5A and 5B. FIGS. 6A through 6C illustrate cross-sectional planes taken along lines A-A', B-B', C-C', and D-D' of FIG. 5A, for describing processes of manufacturing the semiconductor device 100b.

First, an intermediate structure illustrated in FIG. 2J is formed by performing the processes described with reference to FIGS. 2A through 2J.

Referring to FIG. 6A, a fourth blocking layer 218 may be formed by forming an insulating layer (not shown) covering the first and second gate structures 140N and 140P and the first and second source/drain regions 160N and 160P on the NMOS region 110N and the PMOS region 110P, and then, by planarizing an upper portion of the insulating layer until upper surfaces of the first and second gate structures 140N and 140P are exposed. Here, an upper surface of the first spacer 152N covering an upper portion of the first gate structure 140N may be exposed on the NMOS region 110N of the substrate 110, and an upper surface of the fourth spacer 154P covering an upper portion of the second gate structure 140P may be exposed on the PMOS region 110P of the substrate 110.

Referring to FIG. 6B, an upper portion of the fourth blocking layer 218 may be planarized to a height until upper surfaces of the first gate mask 146N and the second gate mask 146P are exposed. Accordingly, the first and third spacers 152N and 154N may be interposed between the first gate structure 140N and the fourth blocking layer 218, and the second and fourth spacers 152P and 154P may be interposed between the second gate structure 140P and the fourth blocking layer 218.

Then, a first gate hole 140NH defined by the first spacer 152N and the channel region CH, and a second gate hole 140PH defined by the second spacer 152P and the channel region CH may be formed by removing the first gate structure 140N and the second gate structure 140P.

Referring to FIG. 6C, a third gate insulating layer 154N and a fourth gate insulating layer 154P may be conformally formed on inner walls of the first gate hole 140NH and the second gate hole 140PH. A third gate electrode 144N-a and a fourth gate electrode 144P-a filling the first gate hole 140NH and the second gate hole 140PH, respectively, may be formed within the inner walls of the third gate insulating layer 154N and the fourth gate insulating layer 154P. The third gate electrode 144N-a and a fourth gate electrode 144P may be formed by depositing a metal layer to fill the first gate hole 140NH and the second gate hole 140PH and performing a planarizing step (e.g., CMP) to expose the fourth blocking layer 218.

According to an exemplary embodiment, the third and fourth gate insulating layers 154N and 154P may be formed of a high dielectric material having a higher dielectric constant than a silicon oxide layer. For example, the third and fourth gate insulating layers 154N and 154P may include $HfO_2$, $ZrO_2$, or $Ta_2O_5$.

According to an exemplary embodiment, the third and fourth gate electrodes 144N-a and 144P-a may include at least one metal layer. For example, the third and fourth gate electrodes 144N-a and 144P-a may be formed as a stack including two or more metal layers. For example, the third and fourth gate electrodes 144N-a and 144P-a may be formed of TiN, TaN, TiC, TaC, W, or Al, or may be formed as a stack including TiN, TaN, TiC, TaC, W, or Al. The third and fourth gate electrodes 144N-a and 144P-a may be formed by using, for example, a damascene process which uses the first and third spacers 152N and 154N and the second and fourth spacers 152P and 154P as a mold.

The first and second source/drain regions 160N and 160P may be formed after third and fourth gate structures 140N-a and 140P-a are formed. Alternatively, the third and fourth gate structures 140N-a and 140P-a may be formed after the first and second source/drain regions 160N and 160P are formed.

Figure 7A:
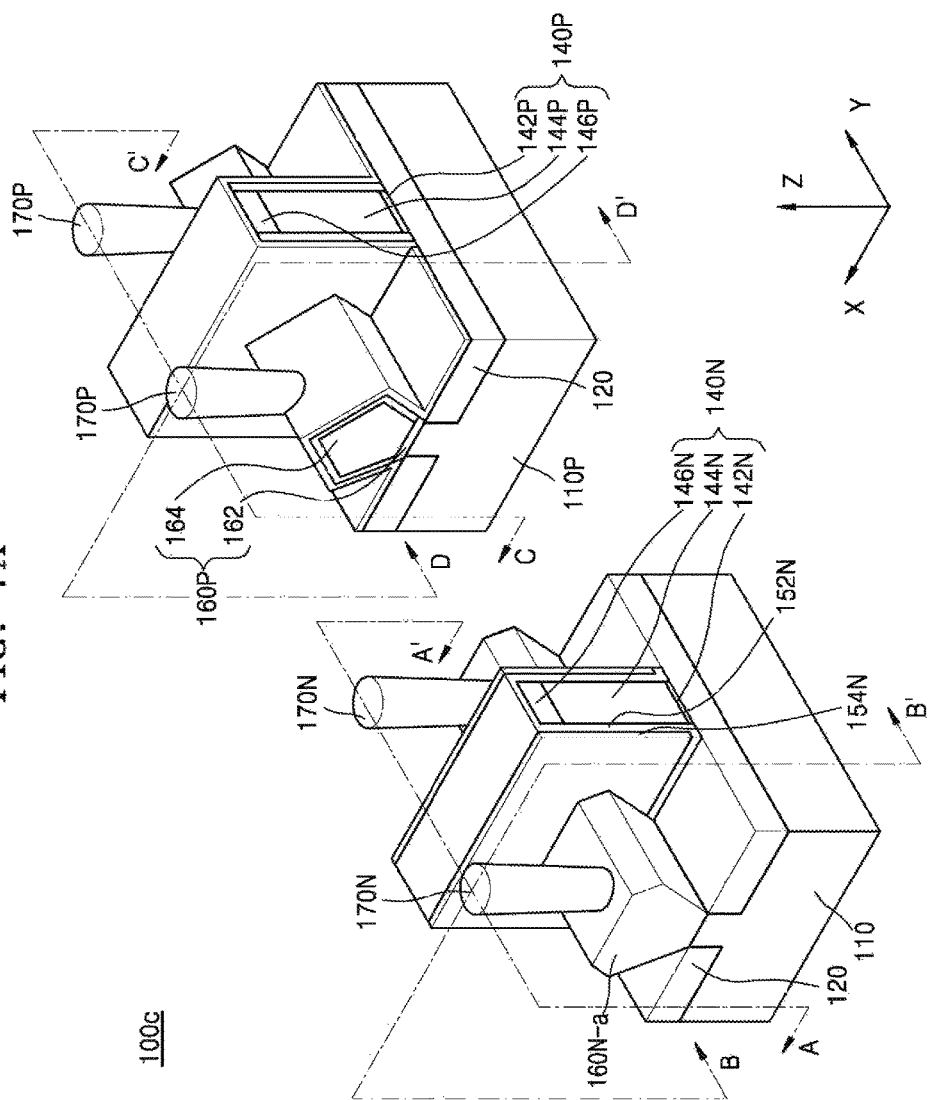
FIG. 7A is a perspective view of a semiconductor device according to an exemplary embodiment.

FIG. 7A is a perspective view of a semiconductor device 100c according to an exemplary embodiment.

Figure 7B:
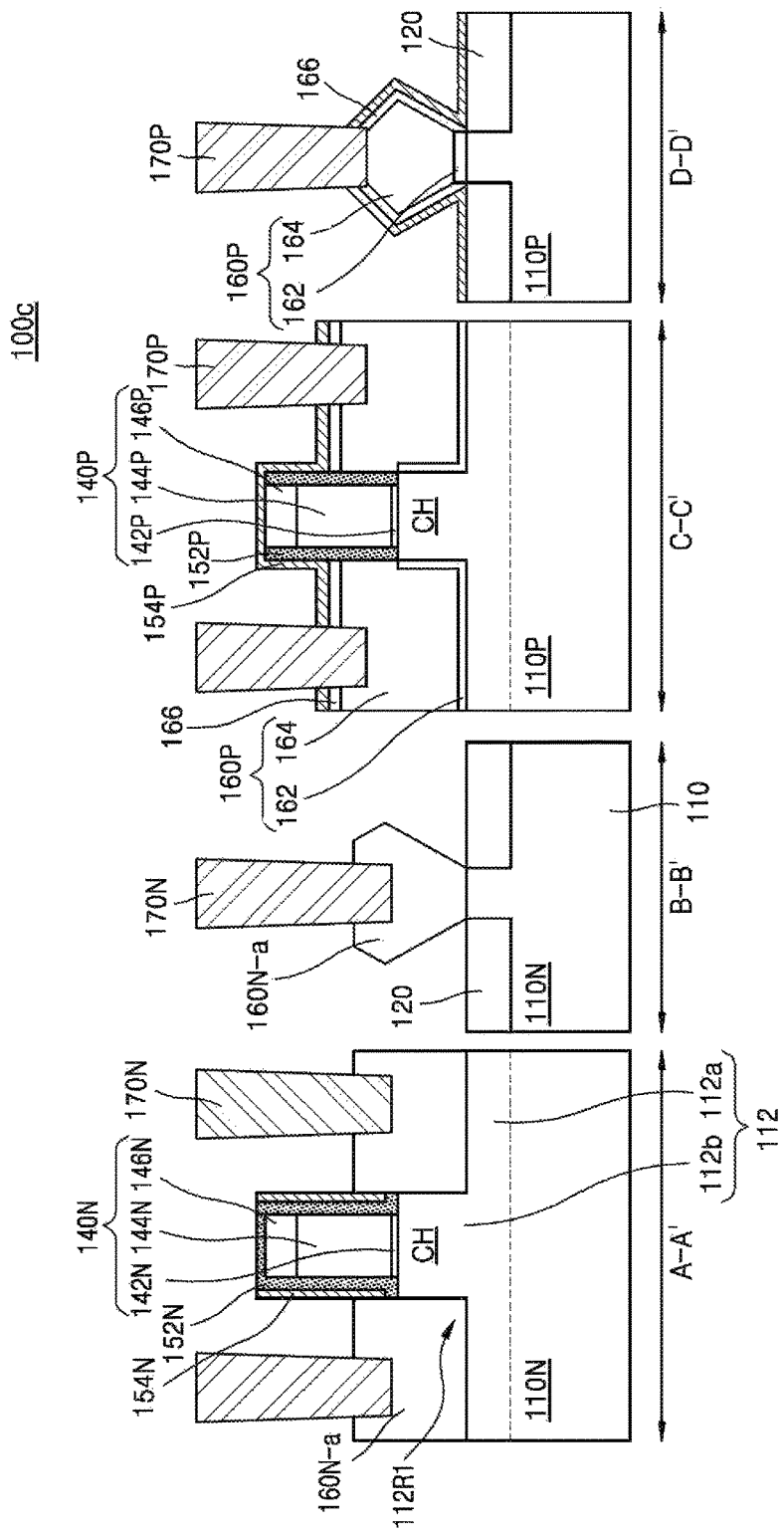
FIG. 7B is a cross-sectional view of a semiconductor device according to an exemplary embodiment.

FIG. 7B is a cross-sectional view of the semiconductor device 100c. FIG. 7B illustrates cross-sectional planes taken along lines A-A', B-B', C-C', and D-D' of FIG. 7A.

Figure 7C:
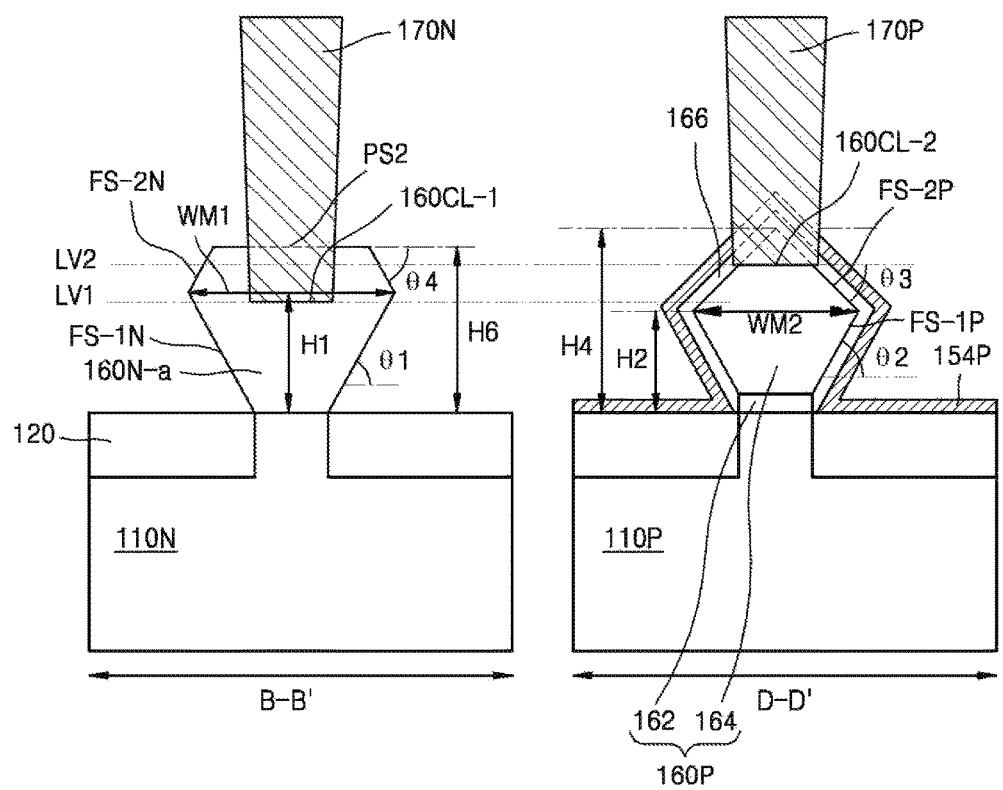
FIG. 7C is a cross-sectional view of a semiconductor device according to an exemplary embodiment.

FIG. 7C is a cross-sectional view of the semiconductor device 100c. In particular, FIG. 7C is an enlarged cross-sectional view taken along lines B-B' and D-D' of FIG. 7A.

The semiconductor device 100c is similar to the semiconductor device 100 described with reference to FIGS. 1A through 1C, except for the shape of a first source/drain region 160N-a, and thus, descriptions will be made by focusing on the difference. Hereinafter, like reference numerals refer to like elements.

Referring to FIGS. 7A through 7C, the first source/drain region 160N-a may be formed to include the first side wall FS-1N extending from an upper surface of the base portion 112a and inclined at a first intersecting angle θ1 with respect to an upper surface of the substrate 110, the fourth side wall FS-2N contacting an uppermost portion of the first side wall FS-1N and inclined at a fourth intersecting angle θ4 with respect to the upper surface of the substrate 110, and a second upper surface PS2 contacting an uppermost portion of the fourth side wall FS-2N and extending in a direction substantially parallel with the upper surface of the substrate 110.

Two fourth side walls FS-2N do not contact each other, and the second upper surface PS2 may contact the two fourth side walls FS-2N, between the two fourth side walls FS-2N. The second upper surface PS2 may flatly extend throughout the entire area or may be substantially parallel to the main surface of the substrate 110. A portion of the second supper surface PS2, which contacts the fourth side wall FS-2N, may have a rounded shape.

According to an exemplary embodiment, an upper portion of the first source/drain region 160N (refer to FIG. 2I) including two fourth side walls FS-2N contacting each other to form an edge as illustrated in FIG. 2I, may be anisotropically etched so that the second upper surface PS2 of the first source/drain region 160N-a may be formed. In other exemplary embodiments, the second upper surface PS2 of the first source/drain region 160N-a may be formed by using an additive that is used to control a growth speed according to a silicon crystallographic plane, in the process of growing the first source/drain region 160N-a. In other exemplary embodiments, the second upper surface PS2 of the first source/drain region 160N-a may be formed by adjusting a type and a flow amount of source gas, and a temperature and a pressure in a chamber, to control the growth speed according to the silicon crystallographic plane, in the process of growing the first source/drain region 160N-a.

A height H6 of the first source/drain region 160N-a, that is, a vertical distance from a bottom surface of the first source/drain region 160N-a to the second upper surface PS2 may be less than or substantially the same as the height H4 of the second source/drain region 160P.

Figure 8A:
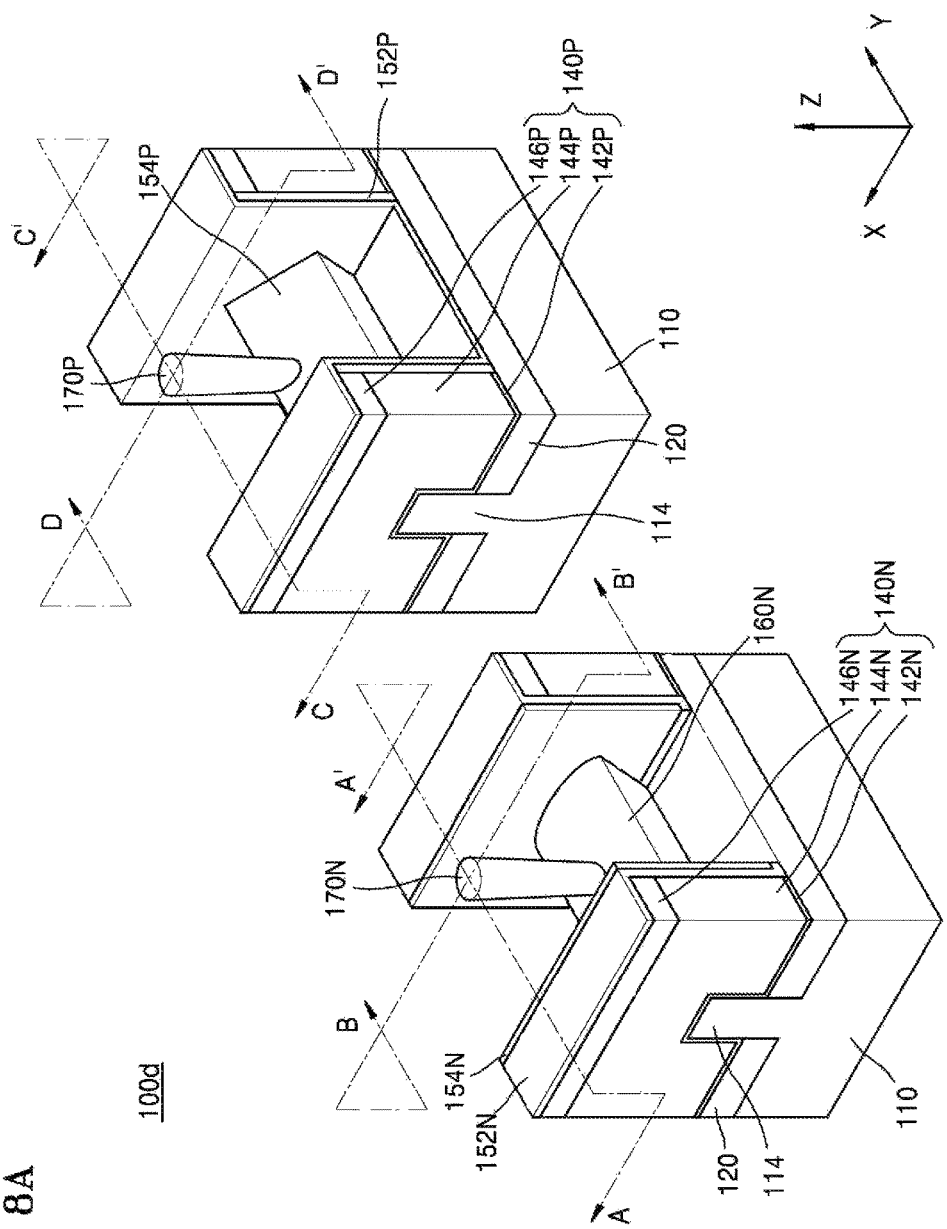
FIG. 8A is a perspective view of a semiconductor device according to an exemplary embodiment.

FIG. 8A is a perspective view of a semiconductor device 100d, according to an exemplary embodiment.

Figure 8B:
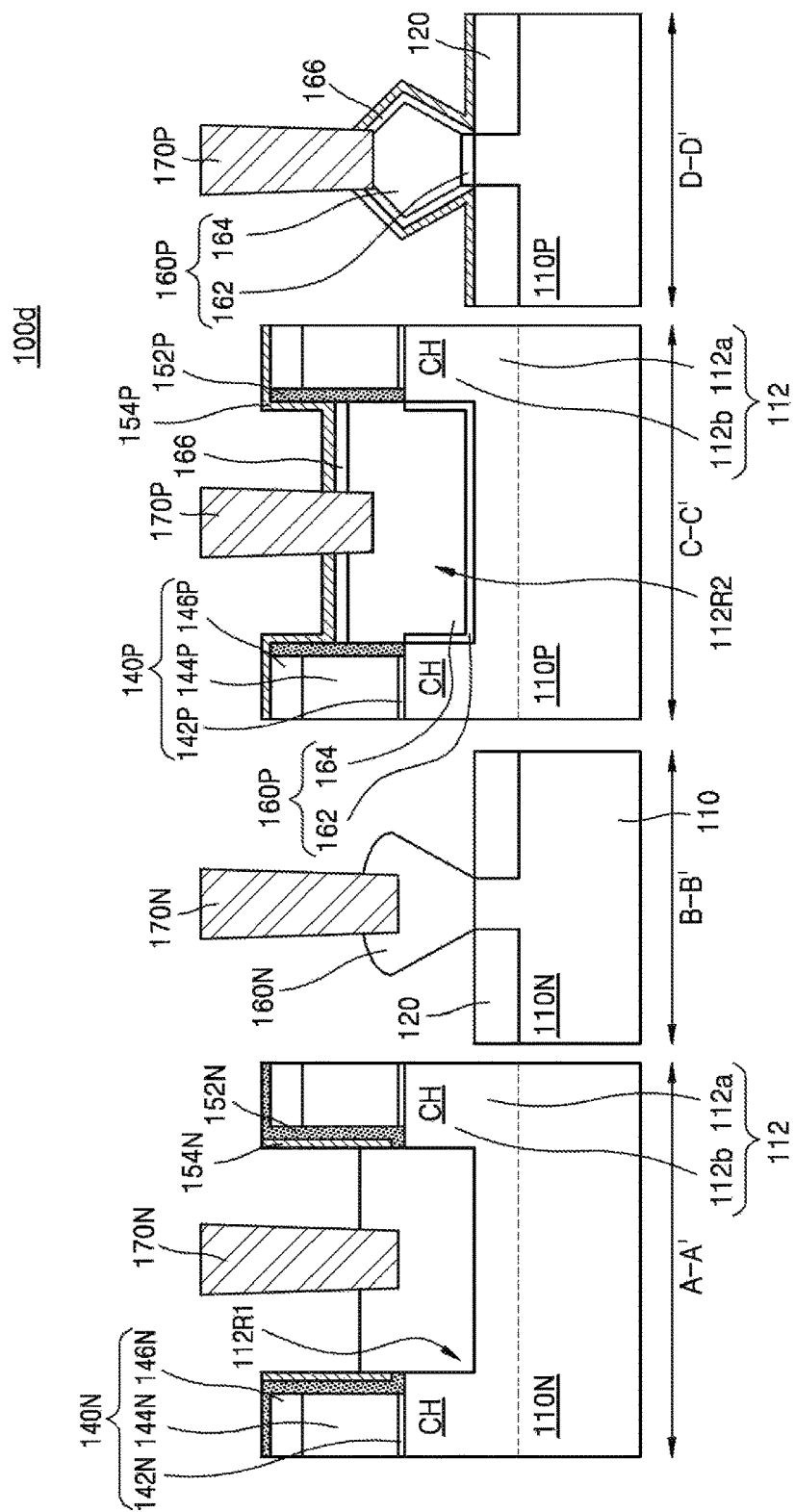
FIG. 8B is a cross-sectional view of a semiconductor device according to an exemplary embodiment.

FIG. 8B is a cross-sectional view of the semiconductor device 100d. FIG. 7B illustrates cross-sectional planes taken along lines A-A', B-B', C-C', and D-D' of FIG. 7A.

The semiconductor device 100d is similar to the semiconductor device 100 described with reference to FIGS. 1A through 1C, except that the semiconductor device 100d has a plurality of channel regions CH. Thus, descriptions will be made by focusing on the difference. Hereinafter, like reference numerals refer to like elements.

Referring to FIGS. 8A and 8B, the fin structure 112 having a pair of channel regions CH and the recess 112R1 located between the pair of channel regions CH may be formed on the substrate 110.

A pair of first gate structures 140N may be provided on the pair of channel regions CH, respectively. The pair of first gate structures 140N may include the first gate electrode 144N extending to cross the fin structure 112, and the first gate insulating layer 142N disposed between the channel region CH and the first gate electrode 144N. The first source/drain region 160N may be formed on a bottom surface of the recess 112R1 between side surfaces of the pair of channel regions CH, the side surfaces facing each other. A pair of first spacers 152N may be formed on upper surfaces and side walls of the pair of first gate structures 140N, and a pair of third spacers 154N may be formed on side walls of the pair of first spacers 152N.

A pair of second gate structures 140P may be provided on the pair of channel regions CH, respectively. The pair of second gate structures 140P may include the second gate electrode 144P extending to cross the fin structure 112, and the second gate insulating layer 142P disposed between the channel region CH and the second gate electrode 144P. The second source/drain region 160P may be formed on a bottom surface of the recess 112R2 between side surfaces of the pair of channel regions CH, the side surfaces facing each other. A pair of second spacers 152P may be formed on upper surfaces and side walls of the pair of second gate structures 140P, and a pair of fourth spacers 154P may be formed on side walls of the pair of second spacers 152P. The pair of fourth spacers 154P may extend from the side walls of the pair of second gate structures 140P to above the second source/drain region 160P located between the pair of second gate structures 140P, and may cover throughout an upper surface of the second source/drain region 160P.

Figure 9:
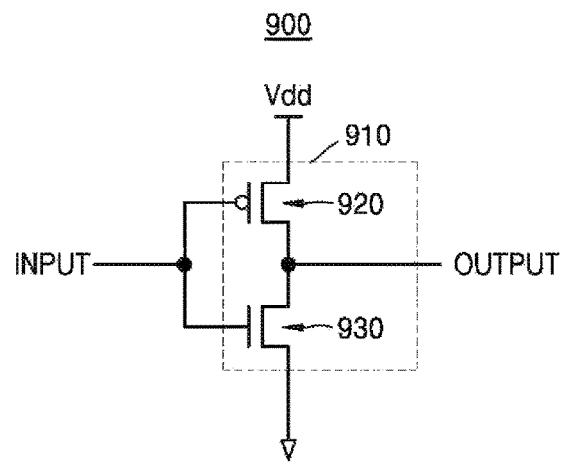
FIG. 9 is a circuit diagram of a CMOS inverter, which is a semiconductor device according to an exemplary embodiment.

FIG. 9 is a circuit diagram of a CMOS inverter 900 according to an exemplary embodiment.

Referring to FIG. 9, the CMOS inverter 900 includes a CMOS transistor 910. The CMOS transistor 910 may include a PMOS transistor 920 and an NMOS transistor 930 connected between a power terminal Vdd and a ground terminal. The CMOS transistor 910 includes at least one of the semiconductor devices 100, 100a, 100b, 100c, and 100d described with reference to FIGS. 1A through 8B.

Figure 10:
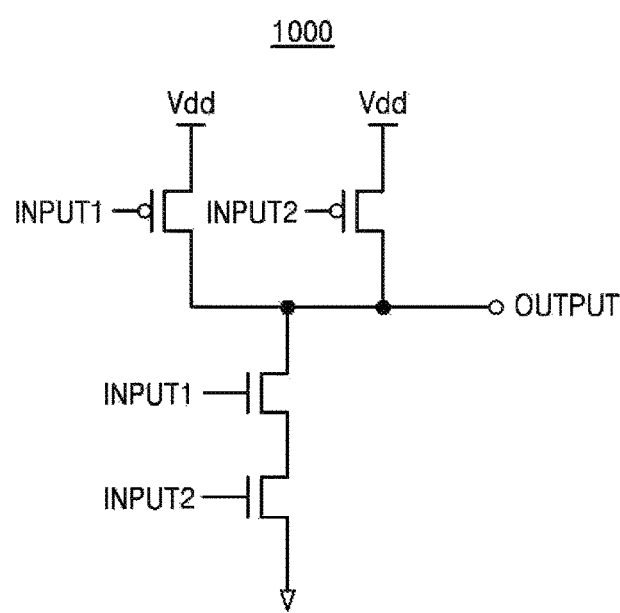
FIG. 10 is a circuit diagram of a CMOS NAND circuit, which is a semiconductor device according to an exemplary embodiment.

FIG. 10 is a circuit diagram of a CMOS NAND circuit 1000 according to an exemplary embodiment.

Referring to FIG. 10, the CMOS NAND circuit 1000 includes a pair of CMOS transistors to which different input signals are transmitted. At least one transistor included in the pair of CMOS transistors includes at least one of the semiconductor devices 100, 100a, 100b, 100c, and 100d described with reference to FIGS. 1A through 8B.

Figure 11:
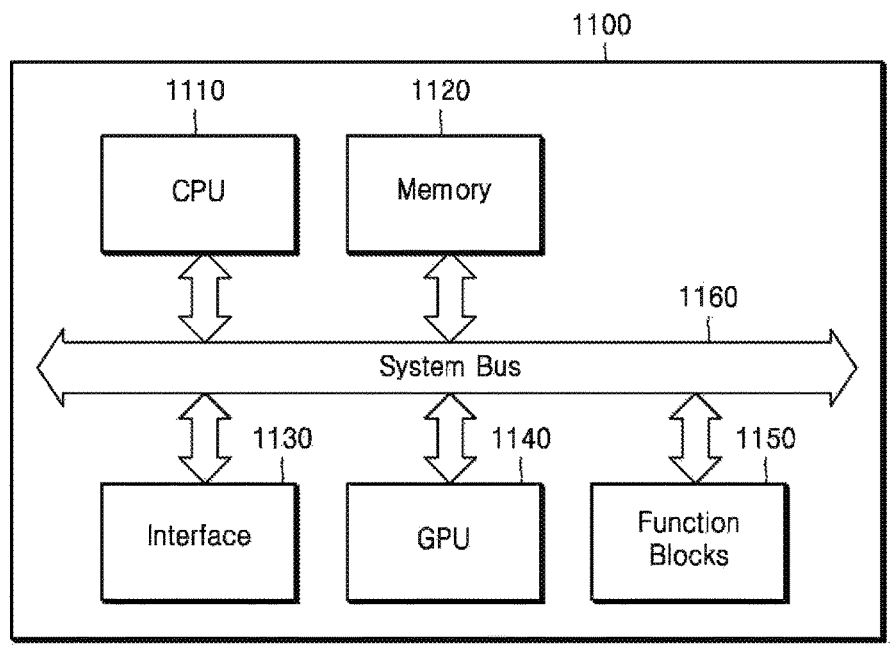
FIG. 11 is a view of a structure of an SOC realized as a semiconductor device according to an exemplary embodiment.

FIG. 11 is a view of a structure of a system on chip (SoC) 1100 realized as a semiconductor device according to an exemplary embodiment.

Referring to FIG. 11, the SoC 1100 may include a central processing unit (CPU) 1110, a memory 1120, an interface 1130, a graphic processing unit (GPU) 1140, function blocks 1150, and a bus 1160 connecting the central processing unit 1110, the memory 1120, the interface 1130, the graphic processing unit 1140, and the function blocks 1150. The central processing unit 1110 may control an operation of the SoC 1100. The central processing unit 1110 may include core and L2 cache. In an example embodiment, the central processing unit 1110 may include multiple cores. Each of the cores in a multi-core CPU may have the same or different performances. Also, each of the cores may have the same or different activation times. The memory 1120 may store results processed in the function blocks 1150 by a control of the central processing unit 1110. For example, when content stored in the L2 cache of the central processing unit 1110 is flushed, the content may be stored in the memory 1120. The interface 1130 may perform an interface with external devices. For example, the interface 1130 may perform an interface with a camera, an LCD, and a speaker.

The graphic processing unit 1140 may perform graphic functions required for the SoC. For example, the graphic processing unit 1140 may perform video codec or 3d graphics.

The function blocks 1150 may perform various functions required for the SoC. For example, when the SoC 1100 is an application used in a mobile device, some of the function blocks 1150 may perform communication functions.

The SoC 1100 includes at least one of the semiconductor devices 100, 100a, 100b, 100c, and 100d described with reference to FIGS. 1A through 8B.

Figure 12:
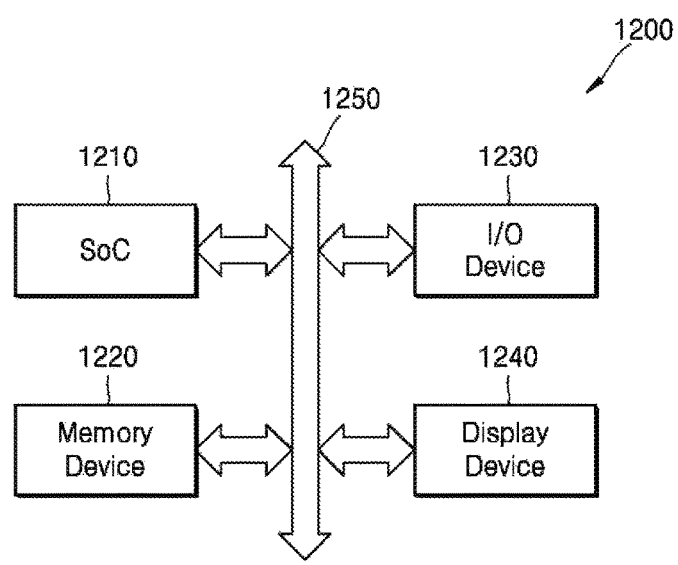
FIG. 12 is a view of an electronic system including an SOC realized as a semiconductor device according to an exemplary embodiment.

FIG. 12 is a view of an electronic system 1200 including an SoC 1210 realized as a semiconductor device according to an exemplary embodiment.

Referring to FIG. 12, the electronic system 1200 may include the SoC 1210. The electronic system 1200 may be, for example, a mobile device, a desk top computer, or a server. Also, the electronic system 1200 may further include a memory device 1220, an input/output device 1230, and a display device 1240, which may be electrically connected with a bus 1250. The SoC 1210 includes at least one of the semiconductor devices 100, 100a, 100b, 100c, and 100d described with reference to FIGS. 1A through 8B.

Figure 13:
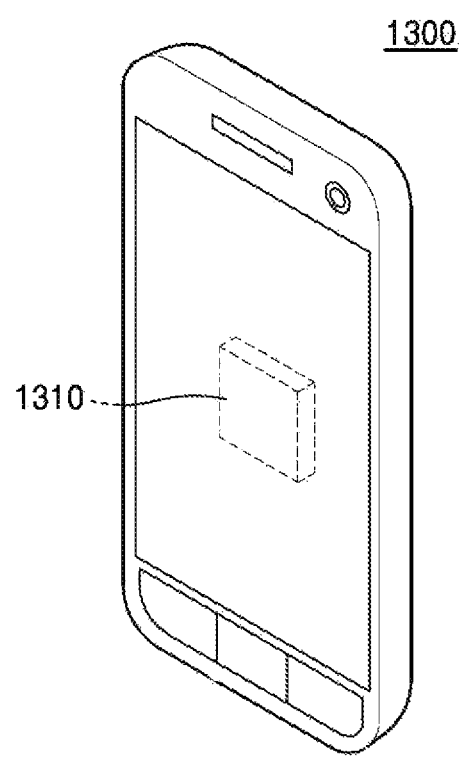
FIG. 13 is a perspective view of an electronic device adopting a semiconductor device according to an exemplary embodiment.

FIG. 13 is a perspective view of an electronic device according to an exemplary embodiment.

FIG. 13 illustrates an example in which the electronic system 1200 of FIG. 12 is adopted in a mobile phone 1300. The mobile phone 1300 may include an SOC 1310. The SoC 1310 includes at least one of the semiconductor devices 100, 100a, 100b, 100c, and 100d described with reference to FIGS. 1A through 8B.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a substrate comprising a first protruding active region and a second protruding active region;
   a first gate structure on the substrate, the first gate structure extending across the first protruding active region in a first direction, the first gate structure including portions horizontally adjacent to sidewalls of the first protruding active region;
   a second gate structure on the substrate, the second gate structure extending across the second protruding active region in the first direction, the second gate structure including portions horizontally adjacent to sidewalls of the second protruding active region;
   a first source/drain region formed on a side of the first gate structure and on the first protruding active region;
   a second source/drain region formed on a side of the second gate structure and on the second protruding active region, the second source/drain region including:
      a first strain inducing layer contacting the first protruding active region, and
      a second strain inducing layer on the first strain inducing layer;
   a second source/drain cap layer on the second source/drain region; and
   a second contact plug formed on the second source/drain region, the second contact plug contacting the second strain inducing layer.

2. The semiconductor device of claim 1, wherein the first strain inducing layer includes silicon germanium having a first germanium content, the second strain inducing layer includes silicon germanium having a second germanium content which is different from the first germanium content, and the second source/drain cap layer includes doped silicon or undoped silicon.

3. The semiconductor device of claim 2, wherein the second germanium content is greater than the first germanium content.

4. The semiconductor device of claim 1, wherein the second strain inducing layer has faceted sidewalls, and the sidewalls include a lower sidewall inclined at a first inclination degree with respect to an upper surface of the substrate and an upper sidewall inclined at a second inclination degree with respect to the upper surface of the substrate, and the upper sidewall meets the lower sidewall.

5. The semiconductor device of claim 4, wherein the first inclination degree is about 51° to about 59° and the second inclination degree is about 51° to about 59°.

6. The semiconductor device of claim 4, wherein the second source/drain cap layer covers the entirety of the lower sidewall and the upper sidewall of the second strain inducing layer.

7. The semiconductor device of claim 1, wherein the second protruding active region has a recess on both sides of the second gate structure, and the first strain inducing layer is disposed on a bottom and a sidewall of the recess.

8. The semiconductor device of claim 7, wherein the first strain inducing layer is disposed between the second protruding active region and the second strain inducing layer and the second strain inducing layer is not in contact with the second protruding active region.

9. The semiconductor device of claim 1, wherein a tangent to a top portion of the first source/drain region is parallel to an upper surface of the substrate and the top portion of the first source/drain region extends along a direction that is parallel to the upper surface of the substrate.

10. The semiconductor device of claim 1, further comprising:
    a first contact plug formed on the first source/drain region;
    wherein, with respect to vertical cross sections taken in a direction parallel to the first direction, a shape of the first contact plug is not symmetric with a shape of the second contact plug,
    wherein the first source/drain region comprises a bottom surface in contact with the first protruding active region,
    wherein the second source/drain region comprises a bottom surface in contact with the second protruding active region, and
    wherein the bottom surface of the first source/drain region is at the same height as the bottom surface of the second source/drain region.

11. The semiconductor device of claim 1, further comprising:
    a first spacer formed on a side wall and an upper surface of the first gate structure; and
    a second spacer formed on a side wall of the second gate structure,
    wherein the first spacer and the second spacer are formed of a first material layer.

12. The semiconductor device of claim 11, further comprising:
    a third spacer formed on the side wall of the first gate structure such that the first spacer is interposed between the third spacer and the first gate structure; and
    a fourth spacer formed on the side wall and the upper surface of the second gate structure such that the second spacer is interposed between the fourth spacer and the second gate structure,
    wherein the third spacer and the fourth spacer are formed of a second material layer.

13. The semiconductor device of claim 12, wherein an upper surface of the first source/drain region is not covered by the second material layer, and at least a portion of an upper surface of the second source/drain region is covered by the second material layer.

* * * * *